United States Patent
Yoshikawa

(10) Patent No.: US 7,276,778 B2
(45) Date of Patent: Oct. 2, 2007

(54) SEMICONDUCTOR SYSTEM FUNCTIONING AS THYRISTOR IN ON-STATE, AND AS BIPOLAR TRANSISTOR IN TRANSIENT STATE OR WITH OVERCURRENT

(75) Inventor: Koh Yoshikawa, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 275 days.

(21) Appl. No.: 11/170,064

(22) Filed: Jun. 30, 2005

(65) Prior Publication Data

US 2006/0006459 A1   Jan. 12, 2006

(30) Foreign Application Priority Data

Jul. 1, 2004   (JP) ............... 2004-196095

(51) Int. Cl.
*H01L 27/082*  (2006.01)
*H01L 27/102*  (2006.01)
*H01L 29/70*   (2006.01)
*H01L 31/11*   (2006.01)

(52) U.S. Cl. ............ 257/577; 257/144; 257/152; 257/157; 257/163; 257/174; 257/378; 257/565; 257/E21.35; 257/E27.079; 257/E29.036; 257/E29.037

(58) Field of Classification Search ............ 257/115, 257/144, 152, 157, 163, 174, 197, 378, 477, 257/565, E21.35, E27.079, E29.036, E29.037; 438/FOR. 140

See application file for complete search history.

(56) References Cited

U.S. PATENT DOCUMENTS

| 4,827,321 A | * | 5/1989 | Baliga | .............. 257/133 |
| 5,241,194 A | * | 8/1993 | Baliga | .............. 257/133 |
| 5,488,236 A | * | 1/1996 | Baliga et al. | .......... 257/132 |

(Continued)

FOREIGN PATENT DOCUMENTS

JP   05-175491   7/1993

(Continued)

*Primary Examiner*—Michelle Estrada
(74) *Attorney, Agent, or Firm*—Rabin & Berdo, P.C.

(57) ABSTRACT

A semiconductor system includes a self arc-extinguishing device, and an IGBT that works as a thyristor when a current between a first terminal and a second terminal connected to a second well electrode is small, and as a bipolar transistor when that current is large, and automatically switches between them according to the magnitude of the current. The IGBT is formed with a first conductivity-type semiconductor substrate. On a surface layer of the substrate is a second conductivity-type well region to which a first well electrode is connected. A first conductivity-type emitter region, to which an emitter electrode is connected, is disposed on a surface layer in the well region. A control electrode is disposed through an insulating film partially covering the well and emitter regions. A second conductivity-type well layer, to which the second well electrode is connected, is disposed on a back surface side of the substrate. The self arc-extinguishing device is connected to the IGBT between the emitter electrode and the first terminal. The rectifying device is connected between the first well electrode and the first terminal.

20 Claims, 15 Drawing Sheets

U.S. PATENT DOCUMENTS

| | | | |
|---|---|---|---|
| 5,874,751 A * | 2/1999 | Iwamuro et al. | 257/140 |
| 6,236,069 B1 * | 5/2001 | Shinohe et al. | 257/138 |
| 6,351,018 B1 * | 2/2002 | Sapp | 257/499 |
| 6,734,497 B2 * | 5/2004 | Takahashi et al. | 257/341 |
| 2002/0003250 A1 * | 1/2002 | Werner | 257/302 |
| 2003/0042575 A1 * | 3/2003 | Takahashi et al. | 257/577 |

FOREIGN PATENT DOCUMENTS

| | | |
|---|---|---|
| JP | 06-031230 | 4/1994 |
| JP | 07-302897 | 11/1995 |
| JP | 2001-284574 | 10/2001 |

* cited by examiner

SEMICONDUCTOR SYSTEM FUNCTIONING AS THYRISTOR IN ON-STATE, AND AS BIPOLAR TRANSISTOR IN TRANSIENT STATE OR WITH OVERCURRENT

CROSS-REFERENCE TO RELATED APPLICATION

This application claims foreign priority under 35 USC 119 of Japanese patent application serial number JP PA 2004-196095, filed Jul. 1, 2004, the entire disclosure of which is incorporated herein by reference.

BACKGROUND OF THE INVENTION

1. Field of the Invention

The present invention relates to a semiconductor system, in particular, a semiconductor system that works as a thyristor in an on-state, and as a bipolar transistor in a transient state during an on/off transition or a state when an overcurrent flows.

2. Description of the Related Art

Recently, among power semiconductor devices, a voltage-drive bipolar device combines an advantage that it has a MOS gate drive structure made of a metal-oxide-semiconductor, which makes it convenient in the controllability to the drive thereof, and another advantage that a saturation voltage is low owing to bipolar operation. Accordingly, such a device has had an expanding range of applications. Furthermore, since a power semiconductor device is used as a noncontact switch, it is better to be low in the occurrence loss. The occurrence loss is in many cases expressed with an index of saturation voltage (on-state voltage drop) verses switching loss trade-off characteristics (hereinafter, simply referred to as trade-off characteristics).

As one of the most effective methods for improving the trade-off characteristics, there are a method in which a base region of a device (drift region) is made thinner and a method in which a concentration of carriers in the vicinity of a surface of the device is made higher. In the former method, the device is proposed to have a FS (field stop) structure. As the latter method, for instance, in the case of an IGBT (insulated gate bipolar transistor), which is a main stream among the voltage drive bipolar devices, a method in which a current path on a surface of a semiconductor is made narrower and thereby a hole concentration in a base region is raised is applied.

Furthermore, as still another method, a method of forming into not a voltage drive-type bipolar transistor such as an IGBT but a voltage drive-type thyristor such as an MCT (MOS controlled thyristor), DGMOS (dual gate MOS thyristor) or EST (emitter switched thyristor) was actively studied in the 1990s. Still furthermore, as a composite system, a composite system of a MOSFET (metal-oxide-semiconductor field effect transistor), a diode and an electrostatic induction thyristor and a composite system of a MOSFET, a diode and an EST are proposed.

For example, Japanese Utility Model Application Laid-Open No. 06-31230 discloses a composite semiconductor system in which a first switching element is cascode-connected to an electrostatic induction thyristor and a constant voltage element is connected between a gate electrode of the electrostatic induction thyristor and the first switching element. In the semiconductor system a second switching element is provided in parallel with the constant voltage element for bypassing a gate current of the electrostatic induction thyristor when the electrostatic induction thyristor is turned-off. According to the Japanese Utility Model Application Laid-Open No. 06-31230, the composite semiconductor system combines characteristics of low power loss with excellent high-frequency characteristics.

Japanese Patent Application Laid-Open No. 07-302897 discloses an insulating gate thyristor that includes a first conductivity-type base layer, a second conductivity-type base layer formed on a surface of the first conductivity-type base layer, a first conductivity-type emitter layer formed in the second conductivity-type base layer, a second conductivity-type emitter layer formed at a place different from the second conductivity-type base layer in the first conductivity-type base layer, a gate electrode disposed through an insulating film on a surface of the second conductivity-type base layer interposed between the first conductivity-type base layer and the first conductivity-type emitter layer, and a first electrode disposed on a surface of the second conductivity-type emitter layer. The insulating gate thyristor also includes a semiconductor switching element that is dielectrically isolated from the first conductivity-type base layer and connected to the first conductivity-type emitter layer, a second electrode connected to the semiconductor switching element, and a semiconductor rectifying device disposed between the second conductivity-type base layer dielectrically isolated from the first conductivity-type base layer and the second electrode. According to Japanese Patent Application Laid-Open No. 07-302897, the on-characteristics and the turn-off capability of the insulating gate thyristor can be improved to realize a larger current system.

However, although the abovementioned existing devices or systems all have trade-off characteristics superior to those of the IGBT, there are disadvantages in that these lack the current saturation characteristics and short circuit capacity that the IGBT has, and a reverse bias safe operating area (RBSOA) is narrow. Accordingly, it cannot be said that these devices or systems are popular products at present. Furthermore, in some voltage drive thyristors such as MCCTs (MOS Controlled Cascode Thyristor), the abovementioned disadvantages are overcome. However, since an IGBT structure is disposed in parallel with a thyristor structure, it is difficult sufficiently to extract an effect of raising a hole concentration in a base region, owing to the thyristor operation.

The invention, in order to overcome the abovementioned problems involving the existing technologies, provides a semiconductor system that includes a voltage drive-type thyristor or a semiconductor device excellent in the trade-off characteristics. Furthermore, the invention provides a semiconductor system that includes a voltage drive-type thyristor or a semiconductor device having a high short circuit capacity.

SUMMARY OF THE INVENTION

In order to overcome the abovementioned problems, a semiconductor system according to a first aspect of the invention includes an IGBT and a self arc-extinguishing device. The IGBT is formed with a first conductivity-type semiconductor substrate. On a surface layer of the semiconductor substrate, a second conductivity-type well region is selectively formed. On a surface layer in the well region, a first conductivity-type emitter region is selectively disposed. A control electrode is disposed on an insulating film that partially covers the well region and the emitter region. A first well electrode is electrically connected to the well region. Furthermore, an emitter electrode is electrically connected to the emitter region. On the other hand, a second conductivity-type well layer is disposed on a back surface side of the semiconductor substrate. A second well electrode is electrically connected to the well layer.

To the IGBT having the above configuration, between the emitter electrode and a first terminal, a self arc-extinguishing device is connected. Furthermore, between the first well electrode and the first terminal, a rectifying device is connected. The IGBT works as a thyristor when a current that flows between the first terminal and a second terminal connected to the second well electrode is small. On the other hand, when that current is large, the IGBT works as a bipolar transistor. Thus, the IGBT automatically switches between a state where it operates as a thyristor and a state where it operates as a bipolar transistor, based on the magnitude of the current that flows between the first and second terminals.

According to the first aspect of the invention, in a low current state of the IGBT, extraction of holes is suppressed and the IGBT works as a thyristor. On the other hand, when the current is large, since holes are extracted, the IGBT works as a bipolar transistor, to perform a current limiting function.

According a second aspect of the invention, the self arc-extinguishing device and the rectifying device of the semiconductor system according to the first aspect of the invention have particular current-voltage characteristics. That is, representing the current, a predetermined current and a rated current of the semiconductor system, respectively, by I, $I_0$ and $I_{rate}$, and representing a voltage drop across the self arc-extinguishing device when the current I flows only to the self arc-extinguishing device, and a voltage drop across the rectifying device when the current I flows only to the rectifying device, respectively by $V_M$ and $V_D$, then when $I<I_0$, $V_M+0.6V<V_D$, and
when $I>I_0$, $V_M>V_D$.

Here, $I_0$ is a value of current when the semiconductor system is used in a normal state and appropriate to be substantially $2\times I_{rate}$.

According to a third aspect of the invention, in a semiconductor system according to the first or second aspect of the invention, when the IGBT is operated at a current equal to or less than the limiting current value of the semiconductor system with the well electrode and the emitter electrode short-circuited, the IGBT operates as a transistor. According to a fourth aspect of the invention, in a semiconductor system according to any one of the first to third aspects of the invention, when the current through the system is equal to the limiting value of the semiconductor system, a voltage drop across the rectifying device is equal to or less than the withstand voltage of the self arc-extinguishing device. According to a fifth aspect of the invention, in a semiconductor system according to any one of the first to fourth aspects of the invention, the self arc-extinguishing device is a MOSFET.

According to a sixth aspect of the invention, in a semiconductor system according to the fifth aspect of the invention, a threshold value of the MOSFET is higher than that of the IGBT. This is a condition necessary for safely turning-off the semiconductor system. At the time of turn-off of a MOSFET connected between the emitter electrode and the first terminal (hereinafter, referred to as a first MOSFET) and a MOSFET on an IGBT side (hereinafter referred to as a second MOSFET), when, the second MOSFET comes into an off-state in advance, a high voltage is applied between drain-source of the first MOSFET; accordingly, the first MOSFET is likely to be destroyed. According to the sixth aspect of the invention, at the time of turn-off, the first MOSFET is turned off earlier than the second MOSFET; accordingly, destruction of the first MOSFET can be avoided.

According to a seventh aspect of the invention, in a semiconductor system according to the fifth aspect of the invention, a limiting current value of the MOSFET is set larger than that of the IBGT. According to an eighth aspect of the invention, in a semiconductor system according to the fifth aspect of the invention, a control electrode of the second MOSFET is electrically connected to a control electrode of the first MOSFET. According to a ninth aspect of the invention, in a semiconductor system according to any one of the fifth to eighth aspects of the invention, when the semiconductor system is in an on-state, the first MOSFET does not operate in a saturation region. According to the ninth aspect of the invention, even when a large current flows owing to a short circuit or the like, it can operate I a stable manner.

According to a tenth aspect of the invention, in a semiconductor system according to any one of the first to ninth aspects of the invention, the rectifying device is a diode. When a forward current of a rated current flows between the second and first terminals of the semiconductor system, in a forward or backward direction of the diode, a significant current does not flow. This is a necessary condition for operating the semiconductor system as a thyristor at substantially two or less times the rated current. Accordingly, according to the tenth aspect of the invention, the semiconductor system operates as a thyristor at substantially two times or less the rated current.

According to an eleventh aspect of the invention, in a semiconductor system according to any one of the first to tenth aspects of the invention, a positive electrode of a diode that constitutes the rectifying device is connected to the first well electrode and a negative electrode thereof is connected to the first terminal. According a twelfth aspect of the invention, in a semiconductor system according to any one of the first to tenth aspects of the invention, a negative electrode of the diode that constitutes the rectifying device is connected to the first well electrode and a positive electrode is connected to the first terminal.

Furthermore, in order to overcome the abovementioned problems and to achieve another object of the invention, a semiconductor system according to a thirteenth aspect of the invention is one in which a diode is combined with a voltage drive thyristor having a trench gate structure. The voltage drive thyristor is formed with a first conductivity-type semiconductor substrate. On a surface layer of the semiconductor substrate, a trench groove is selectively formed. In contact with a sidewall of the trench groove and on a surface layer of the semiconductor substrate, a second conductivity-type well region that is shallower than the trench grove is selectively disposed. Furthermore, in contact with a sidewall of the trench groove and on a surface layer in the well region, a first conductivity-type source region is selectively disposed. Still furthermore, in the well region, a first conductivity-type cathode region that comes into contact with the sidewall of the trench groove is disposed. The cathode region divides the well region into a first well portion that is in contact with the semiconductor substrate and a second well portion that does not come into contact with the semiconductor substrate. Furthermore, the cathode region and the source region are apart.

A control electrode extends through an insulating film that partially covers, along the trench sidewall, a source region, a second well portion, a cathode region and a first well portion. To the first well portion, a well electrode is electrically connected. An emitter electrode is electrically connected to the source region and the second well portion. On the other hand, a second conductivity-type anode layer is disposed on a back surface side of the semiconductor substrate. An anode electrode is electrically connected to the anode layer. Furthermore, a diode is connected between the emitter electrode and the well electrode.

According to the thirteenth aspect of the invention, the voltage drive thyristor, in a low current density state, suppresses the extraction of holes, and thereby operates as a thyristor. On the other hand, in a large current density state, the voltage drive thyristor extracts holes and works as a bipolar transistor to perform the current limiting function. Furthermore, a first MOSFET that is made of a source region, a well region, a cathode region, an insulating film and a control electrode is formed in a vertical direction inside of the semiconductor substrate, that is, in a depth direction of the substrate.

According to a fourteenth aspect of the invention, in a semiconductor system according to the thirteenth aspect of the invention, an oxide film is disposed on a surface of the semiconductor substrate and a polysilicon film constituting a diode is disposed on the oxide film. According to a fifteenth aspect of the invention, in a semiconductor system according to the thirteenth aspect of the invention, an oxide film is buried in the semiconductor substrate and a polysilicon film constituting a diode is disposed on the oxide film. In the fourteenth or fifteenth aspect of the invention, the diode can be formed, for instance, by separately implanting P-type impurity ions and N-type impurity ions in polysilicon on the oxide film. According to the fourteenth or fifteenth aspect of the invention, a voltage drive thyristor and a diode can be disposed on the same semiconductor substrate.

According to a sixteenth aspect of the invention, in a semiconductor system according to any one of the thirteenth to fifteenth aspects of the invention, $C_{s-k} \leq C_{k-b}$. Here, $C_{s-k}$ denotes an impurity concentration highest in a portion that is in contact with a sidewall of the trench groove of the well region and interposed between the source region and the cathode region. Furthermore, $C_{k-b}$ denotes an impurity concentration highest in a portion that is in contact with a sidewall of the trench groove of the well region and interposed between the emitter electrode and the semiconductor substrate.

According to a seventeenth aspect of the invention, in a semiconductor system according to the thirteenth to sixteenth aspects of the invention, when the semiconductor system is in an on-state, the first MOSFET, which is made of a source region, a well region, a cathode region, an insulating film and a control electrode, does not operates in a saturation region. According to the seventeenth aspect of the invention, even when a large current flows owing to a short circuit or the like, a stable operation can be obtained.

According to an eighteenth aspect of the invention, in a semiconductor system according to any one of the thirteenth to seventeenth aspects of the invention, when a rated current flows between the anode electrode and the emitter electrode of the semiconductor system, a significant current does not flow through the diode irrespective of whether the diode is connected in a forward or a backward direction. This is a condition necessary for operating the semiconductor system as a thyristor at the rated current or less. Accordingly, according to the eighteenth aspect of the invention, the semiconductor system operates as a thyristor at or below the rated current.

According to a nineteenth aspect of the invention, in a semiconductor system according to any one of the thirteenth to eighteenth aspects of the invention, a positive electrode of the diode is connected to a well electrode and a negative electrode thereof is connected to an emitter electrode. According to a twentieth aspect of the invention, in a semiconductor system according to any one of the thirteenth to eighteenth aspects of the invention, a negative electrode of the diode is connected to a well electrode and a positive electrode is connected to an emitter electrode.

According to the semiconductor systems according to the invention, semiconductor systems that include a voltage drive thyristor or a semiconductor device exhibiting excellent trade-off characteristics and are high in the short circuit capacity can be realized.

DETAILED DESCRIPTION OF THE PREFERRED EMBODIMENTS

In what follows, with reference to accompanying drawings, preferred embodiments of semiconductor systems according to the invention will be detailed. When embodiments are described, a first conductivity-type is taken as an N-type and a second conductivity-type is taken as a P-type. However, the invention holds similarly even when these are oppositely taken.

Embodiment 1

Figure 1:
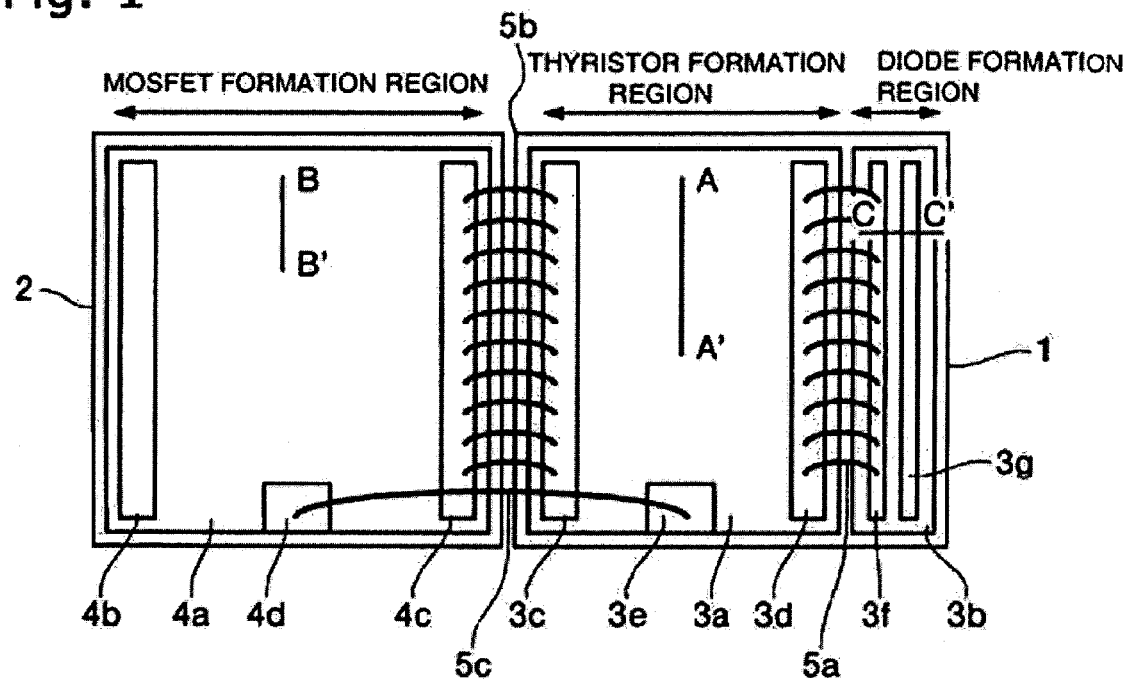
FIG. 1 is a plan view showing an essential portion of a planar configuration of a semiconductor system according to embodiment 1 of the invention.

FIG. 1 is a plan view showing an essential portion of a planar configuration of a semiconductor system according to embodiment 1 of the invention. As shown in FIG. 1, the semiconductor system is constituted of, but not particularly restricted to, for instance, two (first and second) semiconductor chips 1 and 2. On the first semiconductor chip 1, for instance, a thyristor formation region 3a and a diode formation region 3b are disposed.

In the thyristor formation region 3a, a thyristor is formed. The thyristor includes on a surface thereof a cathode electrode (hereinafter, referred to as T cathode electrode) 3c, a well electrode (hereinafter, referred to as T well electrode) 3d and a gate electrode (hereinafter, referred to as T gate electrode) 3e of the thyristor. An anode electrode (hereinafter, referred to as T anode electrode) of the thyristor is disposed on a back surface of the chip (not shown in FIG. 1). In the diode formation region 3b, a diode is formed. The diode has an anode electrode (hereinafter, referred to as D anode electrode) 3f and a cathode electrode (hereinafter, referred to as D cathode electrode) 3g on a surface thereof.

In the second semiconductor chip 2 a MOSFET is formed. On a surface of the MOSFET formation region 4a at the surface of the chip 2, a source electrode (hereinafter, referred to as M source electrode) 4b, a drain electrode (hereinafter, referred to as M drain electrode) 4c and a gate electrode (hereinafter referred to as M gate electrode) 4d of the MOSFET are disposed.

The D cathode electrode 3g and the M drain electrode 4c are connected to a cathode terminal, which is a first terminal (not shown) of the semiconductor system. The T anode electrode is connected to an anode terminal, which is a second terminal (not shown) of the semiconductor system. The T well electrode 3d and the D anode electrode 3f are electrically connected by a bonding wire 5a or the like. The T cathode electrode 3c and the M gate electrode 4c are electrically connected by a bonding wire 5b or the like. The T gate electrode 3e and the M drain electrode 4d are electrically connected by a bonding wire 5c or the like. As will be described below with respect to another embodiment of the invention, a thyristor, a diode and a MOSFET can be formed on the same semiconductor chip.

Figure 2:
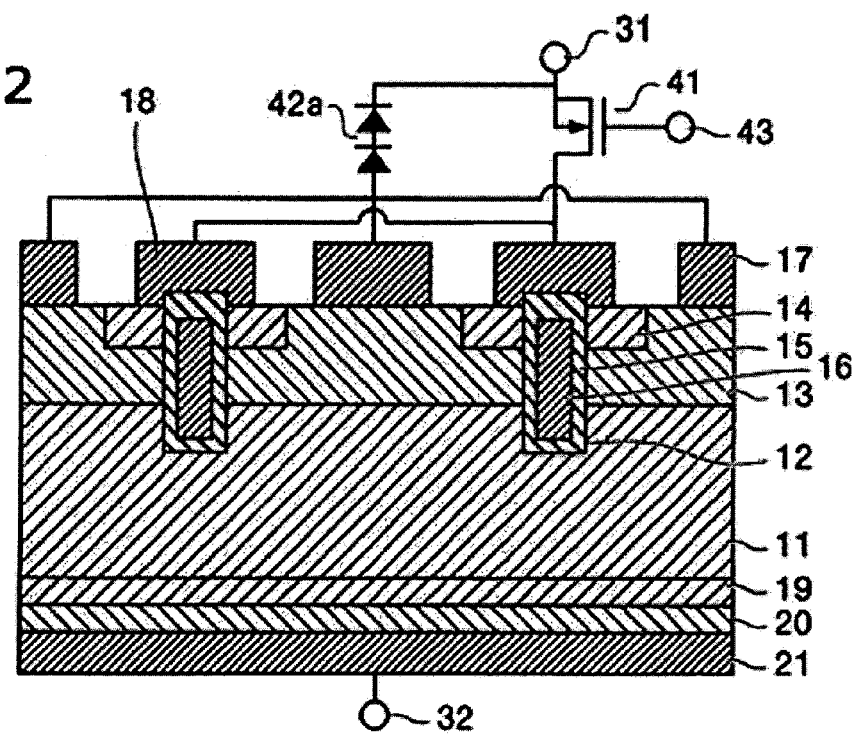
FIG. 2 is a vertical sectional view showing a sectional configuration of a thyristor in a cut-line A-A' in FIG. 1.

FIG. 2 is a vertical sectional view showing a sectional configuration of a thyristor in a cut-line A-A' of FIG. 1. As shown in FIG. 2, the thyristor is formed of an IGBT. The IGBT is formed with an N-type semiconductor substrate 11. In a surface layer of the semiconductor substrate 11, a trench groove 12 is selectively formed. In contact with a sidewall of the trench groove 12 and on a surface layer of the semiconductor substrate 11, a P-type well region 13, shallower than the trench groove 12, is selectively disposed. Furthermore, in contact with the sidewall of the trench groove 12 and on a surface layer inside of the well region 13, an N-type cathode region (emitter region) 14 are selectively disposed.

Inside the trench groove 12, a gate electrode (control electrode) 16 is buried surrounded by a gate insulating film 15 made of, for instance, an oxide film. A well electrode (first well electrode) 17 is electrically connected to the well region 13. To the cathode region 14, a cathode electrode (emitter electrode) 18 is electrically connected. In FIG. 2, the cathode region 14, the well region 13, the cathode electrode 18 and the well electrode 17 appear to be in the same vertical plane. However, in actuality, these are formed alternately in a depth direction of FIG. 2. The gate electrode 16, the well electrode 17 and the cathode electrode 18, respectively, in a planar configuration shown in FIG. 1, correspond to the T gate electrode 3e, the T well electrode 3d and the T cathode electrode 3c.

On a back surface side of the semiconductor substrate 11, a P-type anode layer (well layer) 20 is disposed on an N-type buffer layer 19. To the anode layer 20, an anode electrode (second well electrode) 21 is electrically connected. Between the cathode electrode 18 and a cathode terminal 31, which is a first terminal of the semiconductor system, an N-channel MOSFET 41 is connected as a self arc-extinguishing device. Furthermore, a diode 42a is connected as a rectifying device between the well electrode 17 and the cathode terminal 31. The MOSFET 41 and the diode 42a, in a planar configuration shown in FIG. 1, are formed in the MOSFET formation region 4a and the diode formation region 3b, respectively. The anode electrode 21 on the back surface of the substrate is connected to an anode terminal 32, which is a second terminal of the semiconductor system.

Figure 3:
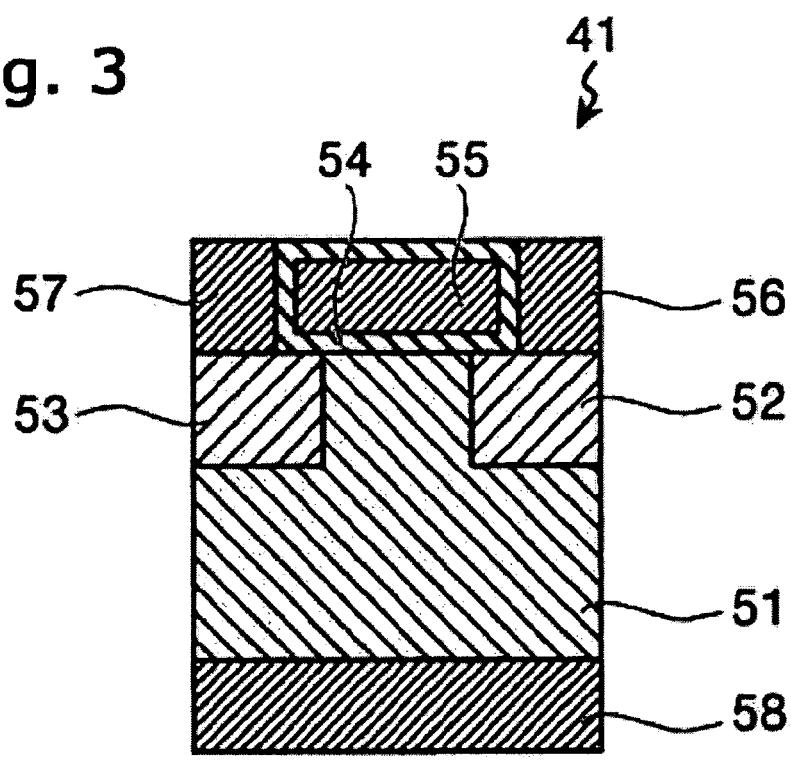
FIG. 3 is a vertical sectional view showing a sectional configuration of a MOSFET in a cut-line B-B' in FIG. 1.

FIG. 3 is a vertical sectional view showing a sectional configuration of the MOSFET 41 in a cut-line B-B' of FIG. 1. As shown in FIG. 3, a MOSFET is formed, for instance, in a horizontal structure with a P-type semiconductor substrate 51 different from the N-type semiconductor substrate 11. In a surface layer of the semiconductor substrate 51, an N-type source region 52 and an N-type drain region 53 are selectively disposed. A gate electrode 55 is disposed through a gate insulating film 54 made of an oxide or the like, on a region where a channel is formed between the source region 52 and the drain region 53 of the semiconductor substrate 51. A source electrode 56 and a drain electrode 57 are electrically connected respectively to the source region 52 and the drain region 53.

A substrate electrode 58 is disposed on a back surface side of the semiconductor substrate 51. The gate electrode 55, the source electrode 56 and the drain electrode 57 are formed in a planar configuration shown in FIG. 1, corresponding respectively to the M gate electrode 4d, the M source electrode 4b and the M drain electrode 4c. Accordingly, as shown in FIG. 2, the MOSFET 41 is constituted with a source terminal (source electrode 56) thereof connected to the cathode terminal 31 of the entire system, a drain terminal (drain electrode 57) connected to the cathode electrode 18 of the IGBT, and a gate terminal 43 (gate electrode 55) connected to the gate electrode 16 of the IGBT.

Figure 4:
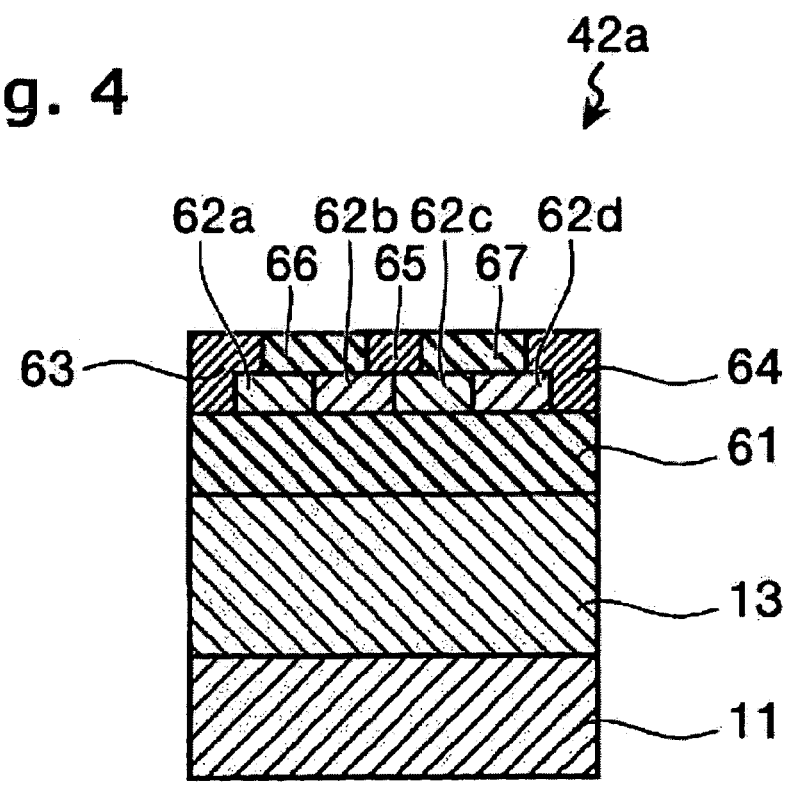
FIG. 4 is a vertical sectional view showing a sectional configuration of a diode in two series configurations in a cut-line C-C' in FIG. 1.

FIG. 4 is a vertical sectional view showing a sectional configuration of the diode 42a in a cut-line C-C' of FIG. 1. As shown in FIG. 4, the diode is formed on the N-type semiconductor same substrate 11 as the IGBT. A P-type well region 13 is disposed on a surface layer of the semiconductor substrate 11. Above the well region 13, through an insulating film 61 such as an oxide film, P-type anode regions 62a and 62c and N-type cathode regions 62b and 62d are alternately disposed. An anode electrode 63 is electrically connected to the P-type anode region 62a at one end, and a cathode electrode 64 is electrically connected to the N-type cathode region 62d at the other end.

A floating electrode 65 is in contact with the N-type cathode region 62b and the P-type anode region 62c, which are respectively in contact with the anode region 62a and the cathode region 62d. These latter region are in turn connected to the electrode 63 and 64. The anode electrode 63, the floating electrode 65 and the cathode electrode 64 are separated from each other by insulating films 66 and 67. The anode electrode 63 and the cathode electrode 64, respectively, in a planar configuration shown in FIG. 1, correspond to the D anode electrode 3f and the D cathode electrode 3g. Accordingly, as shown in FIG. 2, the diode 42a is constituted by connecting two diode elements in series (a two diode series configuration), an anode terminal thereof (anode electrode 63) being connected to the well electrode 17 of the IGBT, and a cathode terminal thereof (cathode electrode 64) being connected to the cathode terminal 31 of the entire system.

Figure 7:
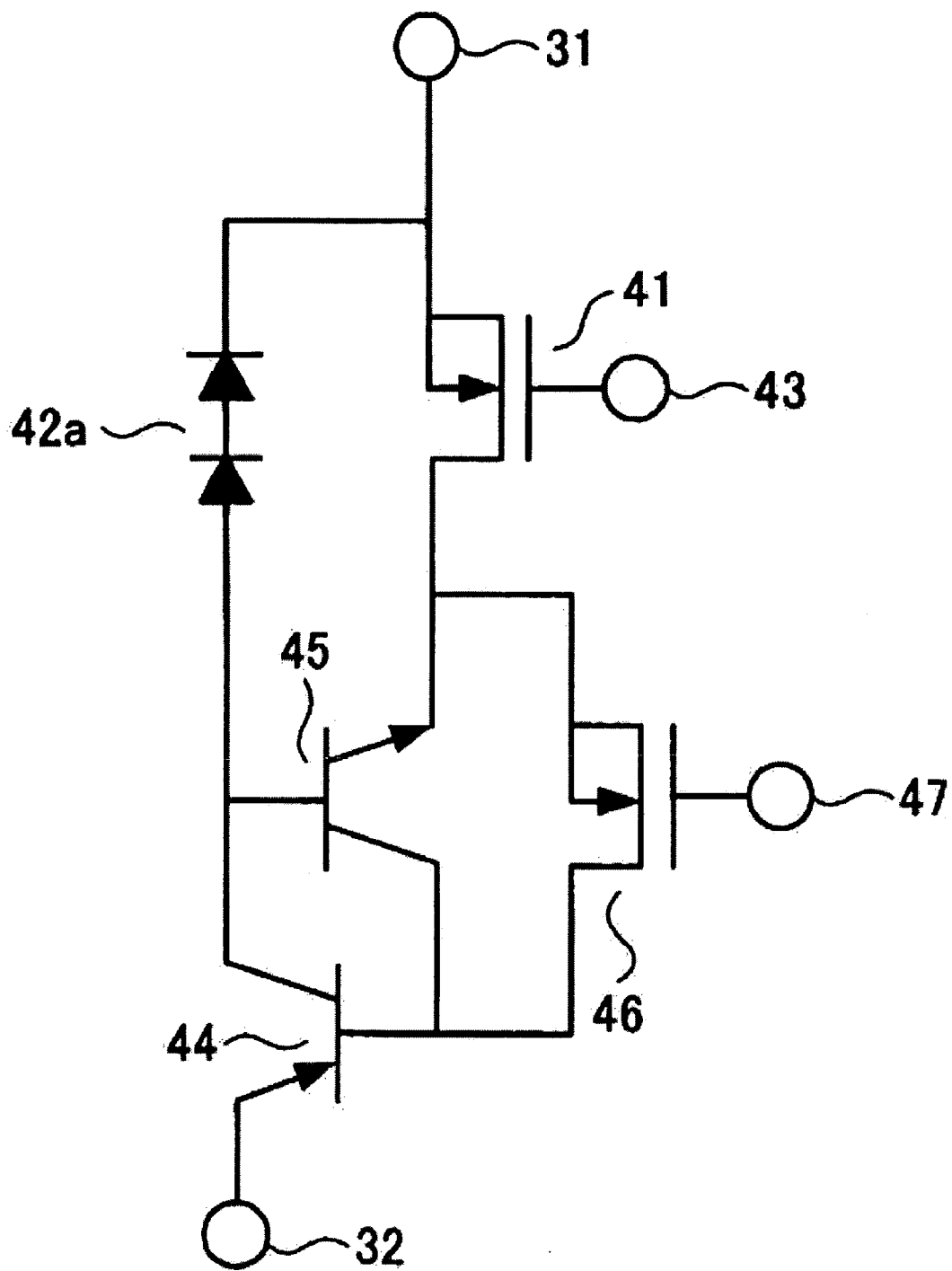
FIG. 7 is a circuit diagram showing an equivalent circuit of a semiconductor system according to embodiment 1 of the invention.

In FIG. 7, an equivalent circuit of the semiconductor system having the above configuration is shown. The semiconductor system is constituted of a PNP transistor 44, an NPN transistor 45, the MOSFET 41, the diode 42a and a MOSFET 46 formed in a thyristor portion. In what follows, when it is necessary to differentiate the two MOSFETs 41 and 46, the MOSFET 41 connected to the cathode terminal 31 is referred to as a first MOSFET 41 and the MOSFET 46 formed in the thyristor portion is referred to as a second MOSFET 46.

To the anode terminal 32 of the entire system, an emitter terminal of the PNP-transistor 44 is connected. A base terminal and collector terminal of the PNP-transistor 44, respectively, are connected to a collector terminal and a base terminal of the NPN-transistor 45. An emitter terminal and a collector terminal of the NPN-transistor 45, respectively, are connected to a source terminal and a drain terminal of the second MOSFET 46. Furthermore, an emitter terminal of the NPN-transistor 45 is connected to a drain terminal of the first MOSFET 41.

A source terminal of the first MOSFET 41 is connected to the cathode terminal 31 of the whole system. A gate terminal 43 of the first MOSFET 41 is connected to a gate terminal 47 of the second MOSFET 46, not shown in FIG. 7. Furthermore, a base terminal of the NPN transistor 45 is connected to an anode terminal of the diode 42a. A cathode terminal of the diode 42a is connected to the cathode terminal 31 of the whole system. An anode voltage applied to the anode terminal 32 is always higher than a cathode voltage applied to the cathode terminal 31.

In a circuit configuration shown in FIG. 7, a thyristor that is constituted of the NPN transistor 45 and the PNP transistor 44 is a primary thyristor. A non-state and off-state of the primary thyristor is controlled with the first MOSFET 41 and the second MOSFET 46. When the thyristor is in the off-state, it is desirable that a PN junction on the NPN transistor 45 side of the PNP transistor 44 takes on most of a voltage applied between the anode terminal 32 and the cathode terminal 31, and the voltage is hardly applied to other devices.

The diode 42a is disposed so as to control a current that flows from the PNP transistor 44 toward a base region of the NPN transistor 45 or the cathode terminal 31. In the diode 42a, when a forward current equal to or less than the rated current flows between the anode terminal 32 and the cathode terminal 31 of the semiconductor system, a significant current does not flow in a forward or a backward direction. By connecting the diode 42a, the semiconductor system operates as a thyristor at a current equal to or less than the rated current, and an operating state of the NPN transistor 45, that is, an operating state of the primary thyristor, in accordance with a potential of a P layer and a current-voltage curve of the diode, varies automatically. Details of the operation will be described later.

The correspondence between the equivalent circuit shown in FIG. 7 and the device structures shown in FIGS. 2 to 4 is as follows. The PNP transistor 44 is constituted of a P layer of an anode layer 20, an N layer made of a buffer layer 19 and a semiconductor substrate 11, and a P layer of the well region 13. The NPN transistor 45 is constituted of an N layer of the semiconductor substrate 11, a P layer of the well region 13 and an N layer of the cathode region 14. The second MOSFET 46 is constituted of the cathode region 14, the well region 13, the semiconductor substrate 11, the gate insulating film 15 and the gate electrode 16. The first MOSFET 41 is the same as that explained above with reference to FIG. 3. The diode 42a is the same as that explained above with reference to FIG. 4.

An example now is described of dimensions, electrical characteristic values and methods of formation of the respective portions when a class of the withstand voltage of a thus configured semiconductor system is 600 V. As to the IGBT that primarily sustains a voltage of the device, the specific resistance and a thickness of the semiconductor substrate 11 are the same as that of the IGBT of which withstand voltage is 600 V class and the withstand voltage thereof is substantially 700 V. The depth and width of the trench groove 12, respectively, are 5 µm and 1 µm. The cell pitch is 10 µm and the cells are arranged in stripes. Furthermore, the buffer layer 19 and the anode layer 20 are formed, for instance, by ion implantation and heat treatment. In a base region of the semiconductor substrate 11, a lifetime killer is not introduced.

Furthermore, as to the first MOSFET 41, the length of the gate is substantially 3.0 µm. The source region 52 and the drain region 53 are formed by implanting, for instance, arsenic (As) ions as an N-type impurity into the semiconductor substrate 51 followed by a heat-treatment.

The well region (not shown) is formed by implanting boron (B) ions as a P-type impurity into the semiconductor substrate 51 followed by a heat-treatment. The width of the gate of the first MOSFET 41 is the same as that of the second MOSFET 46. Furthermore, a threshold value of the second MOSFET 46 is substantially 6.0 V and that of the first MOSFET 41' is substantially 7.0 V; that is, the threshold voltage of the first MOSFET 41 is set larger than the threshold voltage of the second MOSFET 46. The withstand voltage of the first MOSFET 41 is substantially 15 V.

The diode 42a is formed by separately implanting, for instance arsenic (As) ions as an N-type impurity and for instance boron (B) ions as a P-type impurity, to polysilicon formed on an insulating film 61 and having a thickness of 1 µm, followed by forming thereon a floating electrode 65 by patterning a metal film to connect two PN diodes in series. A width of the diode 42a is one tenth the gate width of the second MOSFET 46. The withstand voltage of the diode 42a is substantially 2 V.

Subsequently, an operation of the thus configured semiconductor system will be explained with reference to FIG. 7. At the beginning, an operation when the semiconductor system comes into an on-state will be described. When a voltage equal to or more than the threshold value is applied to the gate terminals 43 and 47 of the first and second MOSFETs 41 and 46, in the two MOSFETs 41 and 46, N channels are formed. Then, through the formed N channels, a base current is supplied to the PNP transistor 44, and thereby the semiconductor system begins operating as a transistor.

Immediately after the semiconductor system starts operating as a transistor, a voltage between the anode terminal 32 and the cathode terminal 31 is not transiently dropped; accordingly, a voltage of a collector terminal of the PNP transistor 44 is higher than a built-in potential of the diode 42a. Accordingly, a collector current of the PNP transistor 44 all flows through the diode 42a to the cathode terminal 31. Then, when, as time goes on, a voltage between the anode terminal 32 and the cathode terminal 31 sufficiently drops and a voltage of the collector terminal of the PNP transistor becomes lower than the built-in potential of the diode 42a, a collector current of the PNP transistor 44 begins flowing to a base terminal of the NPN transistor 45. Thereby, a PNPN thyristor constituted of the PNP transistor 44 and the NPN transistor 45 begins operating.

Such an operation can be realized when the voltage of the collector terminal of the PNP transistor 44 becomes higher than a voltage of an emitter terminal of the NPN transistor 45. For that purpose, the current-voltage characteristics of the diode 42a and the first MOSFET 41 have to be properly selected. Specifically, a drain-source voltage of the first MOSFET 41 when a predetermined current $I_0$ flows only to the first MOSFET 41 is expressed by $V_M$, and an anode-cathode voltage of the diode 42a when a predetermined current $I_0$ is flows only to the diode 42a is expressed by $V_D$, $V_D > V_M + 0.6$ V has only to be satisfied. In a state where the relationship is satisfied, a hole current of the PNP transistor 44, without flowing through a rectifying device 42a, functions as a base current of the NPN transistor 45, and thereby the semiconductor system operates as a thyristor. Here, a certain predetermined current $I_0$ is desirably set at the maximum value of a current density when the semiconductor system is used in a normal state.

Next, an operation when the semiconductor system goes into an off-state will be described. The semiconductor system, when a voltage equal to or less than a threshold value is applied to the gate terminal 43 of the first MOSFET 41 and the gate terminal 47 of the second MOSFET 46, goes into an off-state; however, since a threshold value of the first MOSFET 41 is higher than that of the second MOSFET 46, after the first MOSFET 41 goes into an off-state, the second MOSFET 46 goes into an off-state.

Specifically, when a voltage applied to the gate terminal 43 of the first MOSFET 41 approaches the threshold value, the on-resistance of the first MOSFET 41 increases, and thereby a voltage of the emitter terminal of the NPN transistor 45 goes up. Then, when a voltage of the emitter terminal of the NPN transistor 45 becomes higher than the built-in potential of the diode 42a, a current flows to the diode 42a to reduce a base current of the NPN transistor 45; accordingly, the semiconductor system begins switching from the thyristor operation to the transistor operation.

In this state, when the gate voltage of the first MOSFET 41 becomes equal to or less than the threshold value, the NPN transistor 45 becomes isolated from a current path. Electrons that are excess carriers in the IGBT are swept through the emitter terminal of the PNP transistor 44 out to the anode terminal 32 of the whole system. On the other hand, holes that are excess carriers in the IGBT are swept from the collector terminal of the PNP transistor 44 through the diode 42a out to the cathode terminal 31 of the whole system. While the excess carriers are thus discharged, an anode voltage of the anode terminal 32 goes up significantly, the transistor operation does not occur as a result, and thereby the semiconductor system goes into an off-state.

In order safely to carry out the turn-off operation, it is necessary that the first MOSFET 41 does not cause an avalanche breakdown during operations thereof. A drain voltage of the first MOSFET 41 goes up to substantially a forward voltage of the diode 42a; accordingly, at least the withstand voltage of the first MOSFET 41 is necessarily designed so as to be higher than an amount of voltage drop generated when the maximum current of the semiconductor system flows to the diode 42a.

Next, a case when a current is statically increased will be described. When, with a voltage equal to or more than the threshold value applied to the gate terminals 43 and 47 of the first and second MOSFETs 41 and 46, an anode voltage of the anode terminal 32 is increased, then when the anode voltage exceeds a built-in potential of a PN junction made of the emitter region and the base region of the PNP transistor 44, a base current of the PNP transistor 44 can be supplied; accordingly, the PNP transistor 44 begins operating. As mentioned above, when the current-voltage characteristics of the diode 42a and the first MOSFET 41 are properly selected, the entire collector current of the PNP transistor 44 becomes a base current of the NPN transistor 45, and thereby a PNPN thyristor operates.

When the anode voltage goes up further, the voltage of the collector terminal of the PNP transistor 44 and the voltage of the emitter terminal of the NPN transistor 45 go up. When the voltage of the collector terminal of the PNP transistor 44 exceeds the built-in potential of the diode 42a, a current begins flowing to the diode 42a; accordingly, a voltage of the collector terminal of the PNP transistor 44 becomes substantially a forward voltage of the diode 42a. On the other hand, a voltage of the emitter terminal of the NPN transistor 45 is substantially a result of the on-resistance of the first MOSFET 41; accordingly, when a forward voltage of the diode 42a begins to drop below a voltage due to the on-resistance of the first MOSFET 41, the NPN transistor 45 ceases to operate. That is, the semiconductor system automatically switches to an operation of a PNP transistor.

When, in such a state of the semiconductor system, the anode voltage further goes up to increase a current, the second MOSFET 46 is pinched off. Thereby, irrespective of the anode voltage of the anode terminal 32, the base current supplied to the PNP transistor 44 becomes constant and the anode current hardly increases. Since the NPN transistor 45 has already ceased to operate, the PNP transistor 44 takes on almost all of the anode voltage. By applying a properly designed PNP transistor 44 (for instance, one designed like the IGBT), even when an NMOSFET or a diode whose withstand voltage is low is applied, the current limiting function can be maintained up to a large anode voltage. Such an operation, in a large current region, when the voltage due to the on-resistance of the first MOSFET 41 is set larger than a forward voltage of the diode 42*a*, can be realized. Here, a design like the IGBT means a design in which a current value is equal to or less than the limiting current and a sum of a current amplification rate of the NPN transistor 45 and that of the PNP transistor 44 do not exceed 1.

Next, as to a short circuit state, a case when a current is dynamically increased will be described. When, with a sufficient anode voltage supplied to the anode terminal 32 and the impedance of a circuit kept sufficiently small, a gate voltage equal to or more than the threshold value is applied to the first and second MOSFETs 41 and 46, similarly to the operation in the on-state as explained above, the semiconductor system begins operating as a transistor. However, since the impedance of the circuit is sufficiently small and the anode voltage of the anode terminal 32 does not decrease, a voltage of the collector terminal of the PNP transistor 44 also does not decrease. Accordingly, the current flows not to the NPN transistor 45 but to the diode 42*a*, and thereby the semiconductor system operates as a PNP transistor.

In this case, the first and second MOSFETs 41 and 46 that supply a base current of the PNP transistor 44 are pinched-off owing to an increase in the current; accordingly, a current is limited. This operation state is substantially the same as the short circuit state of the IGBT; accordingly, the short circuit capacity can be assured. As is apparent from the above explanation, the semiconductor system is a voltage drive thyristor, can automatically switch to a thyristor mode and a transistor mode, and has a current limiting function.

Figure 5:
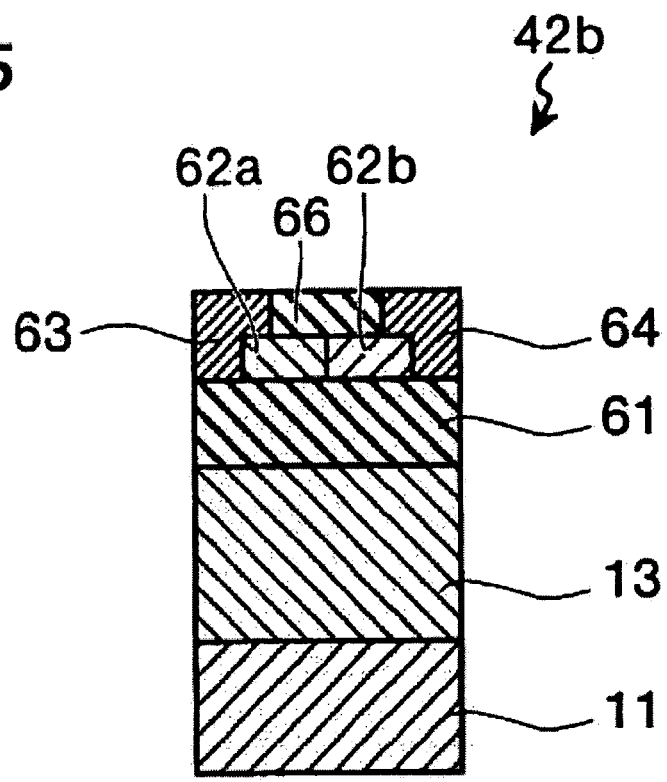
FIG. 5 is a vertical sectional view showing a sectional configuration of a diode in one series configuration in the cut-line C-C' in FIG. 1.

A diode having a single PN junction may be used as a rectifying device connected between the well electrode 17 and the cathode terminal 31. FIG. 5 is a vertical sectional view showing a sectional configuration in a cut-line C-C' of FIG. 1 of a diode 42*b* having a single PN junction. The diode 42*b* shown in FIG. 5 is formed by removing the anode region 62*c*, the cathode region 62*d* and the floating electrode 65 from a configuration of the diode 42*a* shown in FIG. 4 and by electrically connecting the cathode electrode 64 to the cathode region 62*b*.

Figure 6:
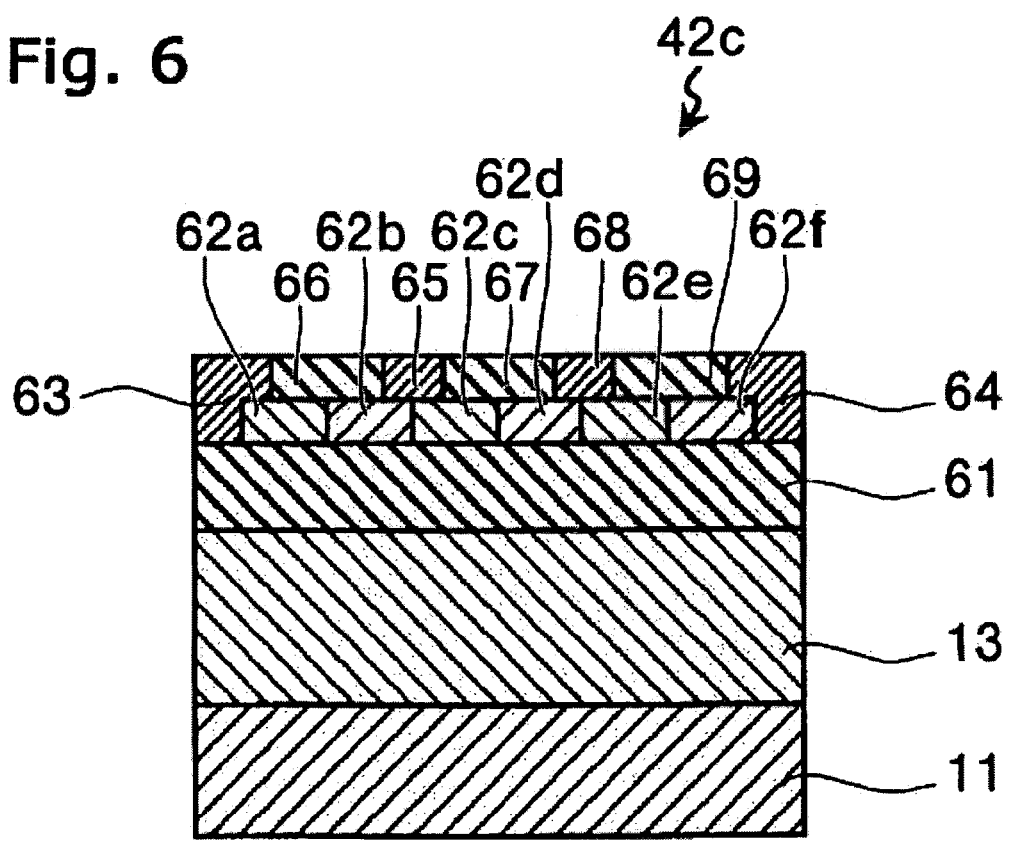
FIG. 6 is a vertical sectional view showing a sectional configuration of a diode in three series configurations in the cut-line C-C' in FIG. 1.

Furthermore, as the rectifying device, one in which at least three diodes are connected in series can be used. FIG. 6 is a vertical sectional view showing a sectional view in a cut-line C-C' of FIG. 1 of a diode 42*c* having a configuration of three series-connected diodes. The diode 42*c* shown in FIG. 6 can be formed as follows: An anode region 62*e*, a cathode region 62*f* and a floating electrode 68 are added to the configuration of the diode 42*a* shown in FIG. 4. The cathode region 62*d* and the anode region 62*e* are connected with the floating electrode 68. The cathode electrode 64 is electrically connected to the cathode region 62*f* via a PN connected with the anode region 62*e*. The anode electrode 63, the floating electrodes 65 and 68 and the cathode electrode 64 are insulated from each other with insulating films 66, 67 and 69.

Figure 8:
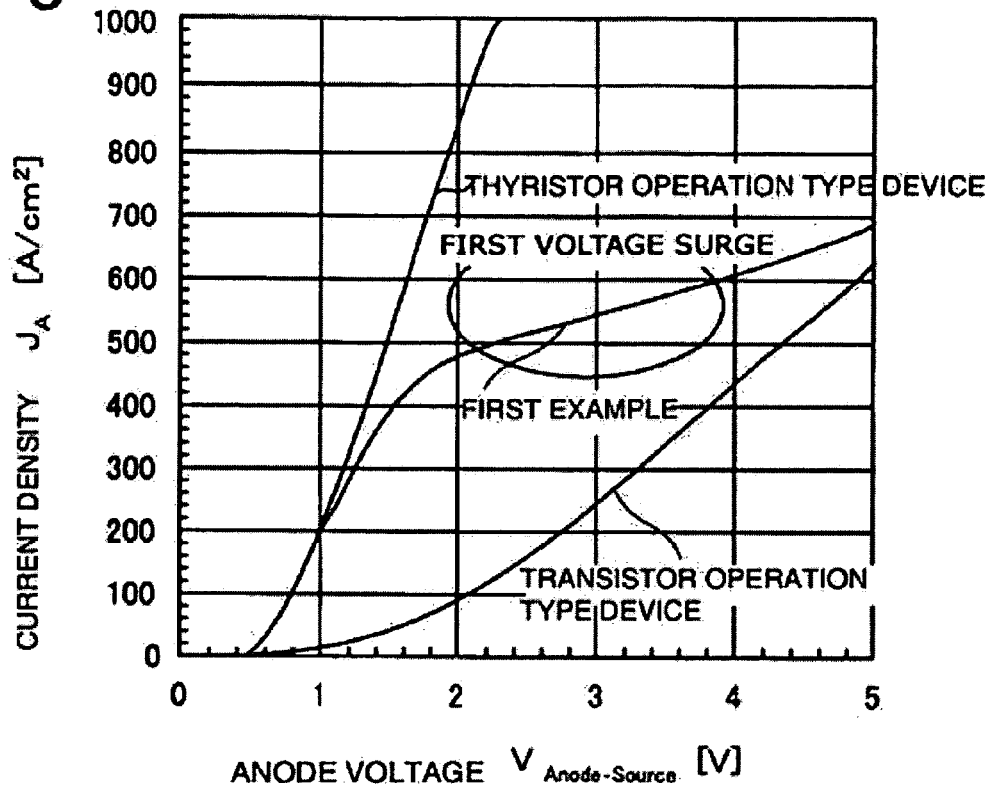
FIG. 8 is a characteristic diagram showing the current-voltage characteristics of a semiconductor system according to embodiment 1 of the invention.
Figure 9:
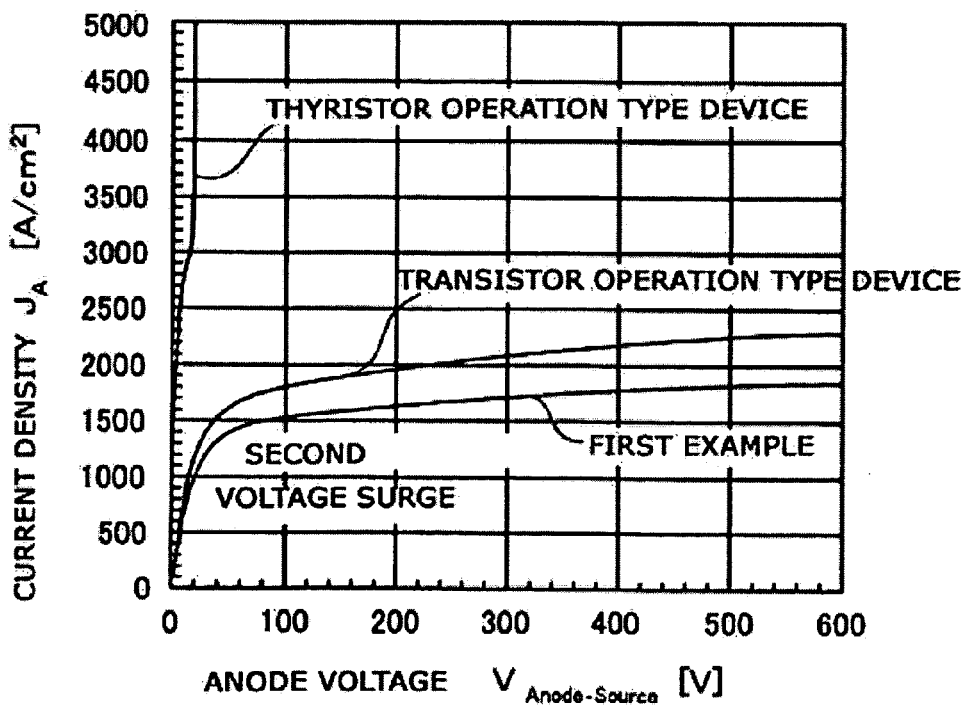
FIG. 9 is a characteristic diagram showing the current-voltage characteristics of a semiconductor system according to embodiment 1 of the invention.

In FIGS. 8 and 9, the current-voltage curves of three kinds of semiconductor devices shown in FIGS. 2 through 4 are shown. Here, the three kinds of semiconductor devices are each connected so as to provide a circuit configuration shown in FIG. 7 and thereby to form a 600 V class device (this is taken as a first example) and operated at a gate voltage of 15 V and a temperature of 125 degrees centigrade. FIG. 8 is a current-voltage curve for a device in which ranges of the anode voltage and current density are, respectively, 0 to 5 V and 0 to 1000 A/cm$^2$, and FIG. 9 is a current-voltage curve for a device in which ranges of the anode voltage and current density are, respectively, 0 to 600V and 0 to 5000 A/cm$^2$. For reference purposes, the current-voltage curves of a device in which the cathode electrode 18 of the thyristor portion shown in FIG. 2 and the drain electrode 57 of the first MOSFET 41 shown in FIG. 3 are connected and the diode 42*a* is removed (hereinafter, referred to as thyristor operation-type device), and a device in which the cathode electrode 18 and the well electrode 17 of the thyristor portion are short-circuited and the first MOSFET 41 and the diode 42*a* are removed (hereinafter, referred to as transistor operation-type device) are shown together in FIG. 8.

The thyristor operation-type device lacks an electrode for extracting a hole current on a cathode side of the thyristor portion. Accordingly, the thyristor operation is caused, and, even when a voltage between the anode terminal 32 and the cathode terminal 31 is low, a large current can be created so as to obtain a low saturation voltage. When the current becomes larger, a voltage of the cathode region 14 of the thyristor portion, that is, the voltage of the drain electrode 57 of the first MOSFET 41 goes up; as a result, the first MOSFET 41 is pinched-off. Accordingly, in the thyristor operation-type device, the current begins saturating at substantially 3000 A/cm$^2$. However, at substantially a withstand voltage of the first MOSFET 41, the current begins increasing once more. When the current is further increased, the first MOSFET 41 is ultimately destroyed.

On the other hand, since the transistor operation-type device has an electrode enough large to extract a hole current on the cathode side of the thyristor portion, the thyristor operation is not caused to occur. Accordingly, the saturation voltage is high. However, when the current increases, the second MOSFET 46 is pinched-off; accordingly, the current saturates at substantially 2000 A/cm$^2$. After that, the current hardly increases and the current saturation characteristics are maintained up to 600 V, corresponding to the withstand voltage class of the device. This is the same as the current saturation characteristics of the IGBT.

In contrast, in a region where the current density is small, such as substantially 400 A/cm$^2$ or less, the device according to the first example, exhibits utterly the same output characteristics as those of the thyristor operation-type device, and has a low saturation voltage. Then, as the current increases, a first voltage surge appears at the current density in the vicinity of substantially 500 A/cm$^2$, and thereafter a second voltage surge appears in the vicinity of substantially 1500 A/cm$^2$. When the second voltage surge appears, the current hardly increases. Even when the anode voltage reaches 600 V, an occurrence of avalanche breakdown is not found. A reason why the first voltage surge occurs is that because a voltage of the well electrode 17 exceeds the built-in potential of the diode 42*a*, the current begins flowing to the diode 42*a*, and thereby the device according to the first example shifts from the thyristor operation mode to the transistor operation mode. As a result, in the device according to the first example, the same current saturation characteristics as those of the abovementioned transistor operation-type device appear.

A current when the first voltage surge occurs, that is, a current when the thyristor operation mode switches to the transistor operation mode can be altered by changing the diode 42a. Devices with the circuit configuration shown in FIG. 7, that are formed by connecting the three kinds of semiconductor devices shown, respectively, in FIGS. 2, 3 and 5 are taken as a second example, and devices with the circuit configuration shown in FIG. 7 that are formed by connecting the three kinds of semiconductor devices shown respectively in FIGS. 2, 3 and 6 are taken as a third example.

Figure 10:
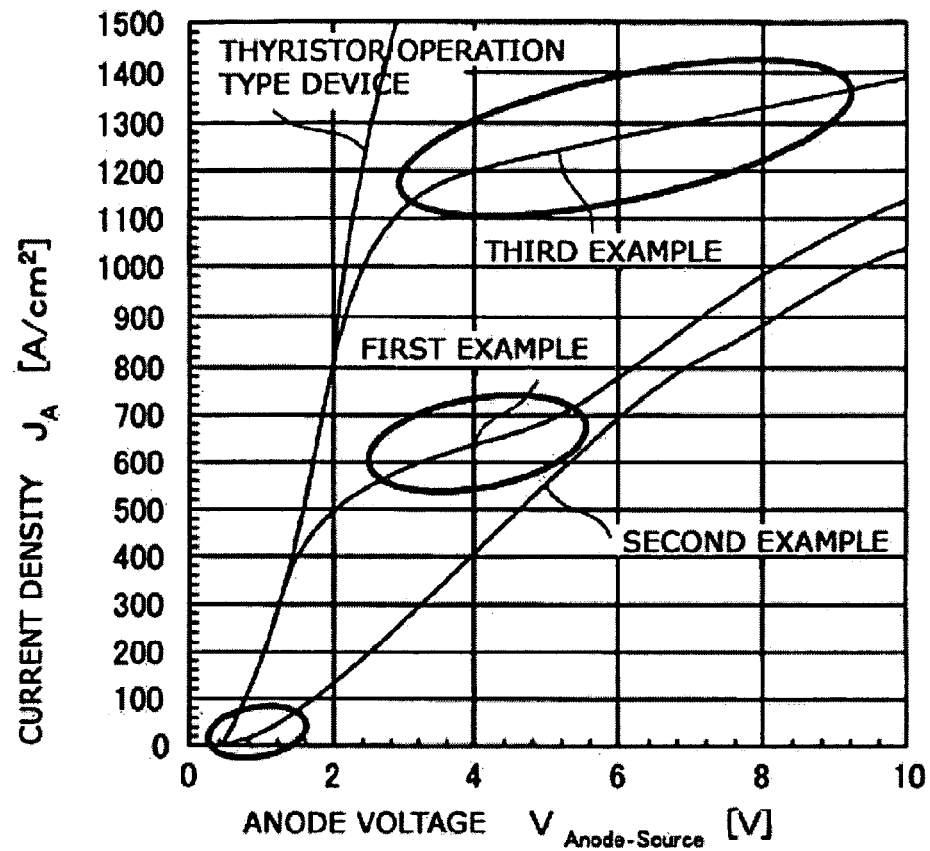
FIG. 10 is a characteristic diagram showing the current-voltage characteristics of a semiconductor system according to embodiment 1 of the invention.
Figure 11:
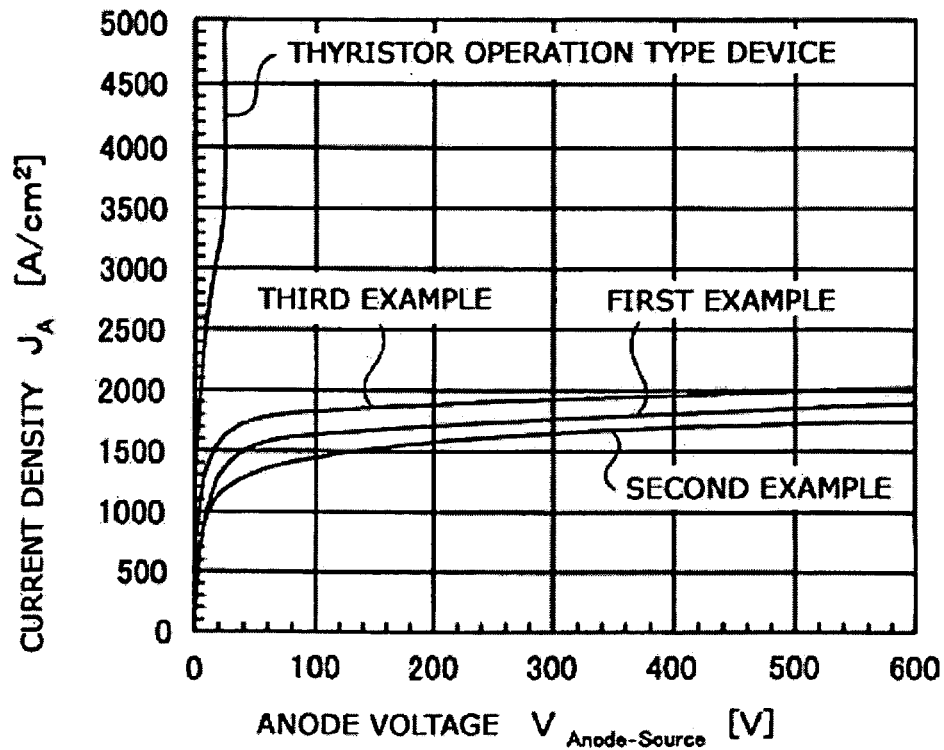
FIG. 11 is a characteristic diagram showing the current-voltage characteristics of a semiconductor system according to embodiment 1 of the invention.
Figure 12:
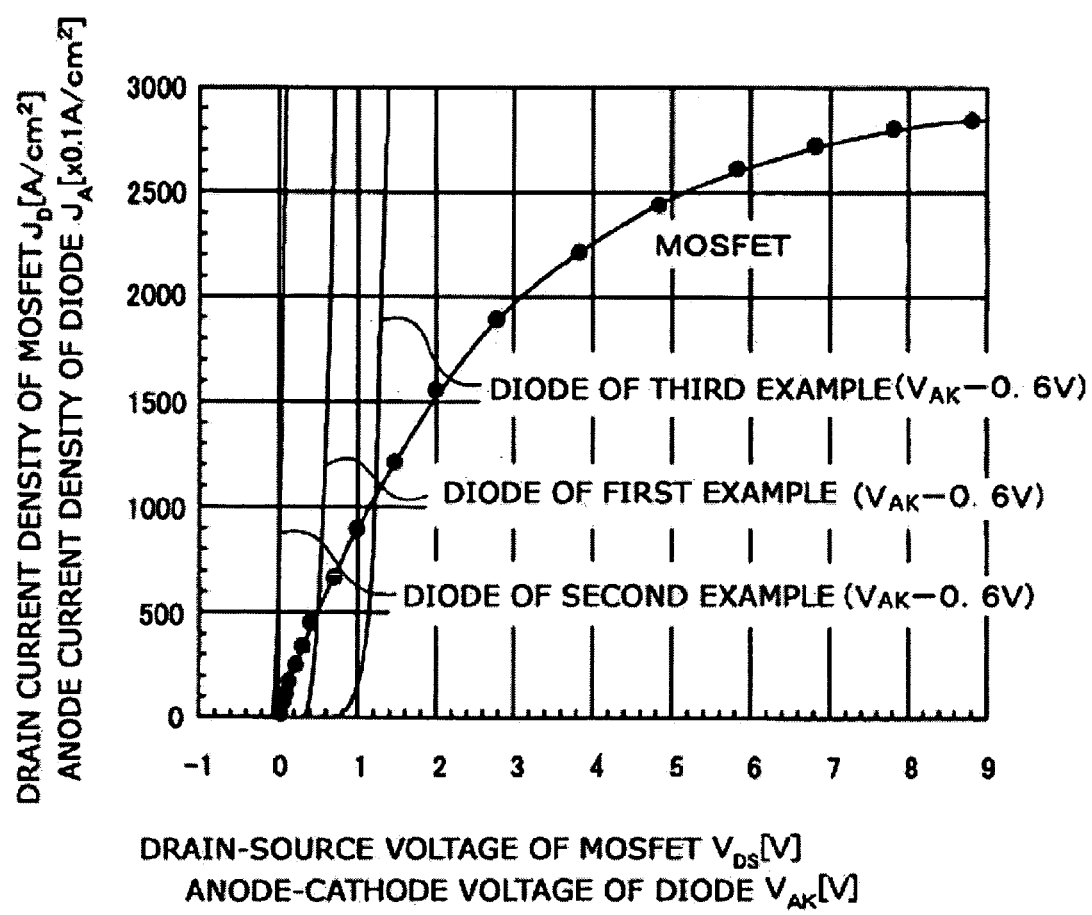
FIG. 12 is a characteristic diagram showing the output characteristics of a MOSFET and a diode constituting a semiconductor system according to embodiment 1 of the invention.

In FIGS. 10 and 11, the current-voltage characteristics when the respective devices according to the first through third examples of 600 V class are operated at a gate voltage of 15 V and at 125 degrees centigrade are shown. In FIG. 10, current-voltage curves for devices of which ranges of the anode voltage and current density, respectively, are 0 to 10 V and 0 to 1500 A/cm$^2$ are shown, and in FIG. 11, current-voltage curves for devices of which ranges of the anode voltage and current density, respectively, are 0 to 600 V and 0 to 5000 A/cm$^2$ are shown. Furthermore, in FIG. 12, the output characteristics of the respective first MOSFETs 41 of the first through third examples and the diodes 42a, 42b and 42c are shown, wherein $V_{AK}$ is thee anode-cathode voltage of the diode and $V_{DS}$ is the drain-source voltage of the MOSFET.

From FIGS. 10 and 11, it can be seen that, as the number of serially connected diodes increases, a voltage at which the first voltage surge occurs becomes higher. The current values when the first voltage surge occurs nearly correspond to current values where the output characteristics of the first MOSFET 41 intersect with ones that are obtained by subtracting 0.6 V from the output characteristics of the respective diodes 42a, 42b and 42c. This is because the larger is the number of serially connected diodes, the higher becomes a potential of the well region 13 necessary for flowing the collector current of the PNP transistor 44 toward the diodes 42a, 42b and 42c.

Accordingly, in place of altering the number of serially connected diodes, a similar result can be obtained also by changing the material of the diode to one higher in the built-in potential, such as SiC. Furthermore, also when the diodes are connected in a reverse manner to increase the withstand voltage of the diode, a similar result can be obtained. In general, since the current density of the 600 V class device is substantially 200 A/cm$^2$, in the case of using a diode made of polysilicon, when the number of serially connected diodes is set at substantially two, the voltage becomes substantially 1 V. Accordingly, a device that operates as a thyristor in a steadily used current region can be obtained.

When the number of serially connected diodes is further increased, then up to a high current density region utterly the same current-voltage curve as that of the thyristor operation-type device is exhibited, and a voltage surge due to a current saturation of the first MOSFET 41 seen in the vicinity of 3000 A/cm$^2$ appears. However, since the on-resistance of the first MOSFET 41 desirably is low, a device with a low withstand voltage is used as the first MOSFET 41. Accordingly, like the thyristor operation-type device, the current saturation characteristics for such a device are not exhibited. Such a situation is a state where an excessive load is applied on the first MOSFET 41; accordingly, it is likely that the first MOSFET 41 is destroyed, resulting in destruction of an overall device.

Accordingly, such a situation desirably is avoided. For that purpose, it is necessary only to assure that at a voltage equal to or less than a voltage where the first MOSFET 41 begins the saturation operation, a sufficient current may flow to the diode. From FIG. 12, a current density value where the first MOSFET 41 begins the saturation operation is substantially 3000 A/cm$^2$, and at this time a drain-source voltage of the first MOSFET 41 is substantially 8 V. A forward voltage of the diode when this current density value flows is substantially 1 V also in the third example; accordingly, a potential difference sufficient to inhibit the NPN transistor 45 from operating can be obtained.

Figure 13:
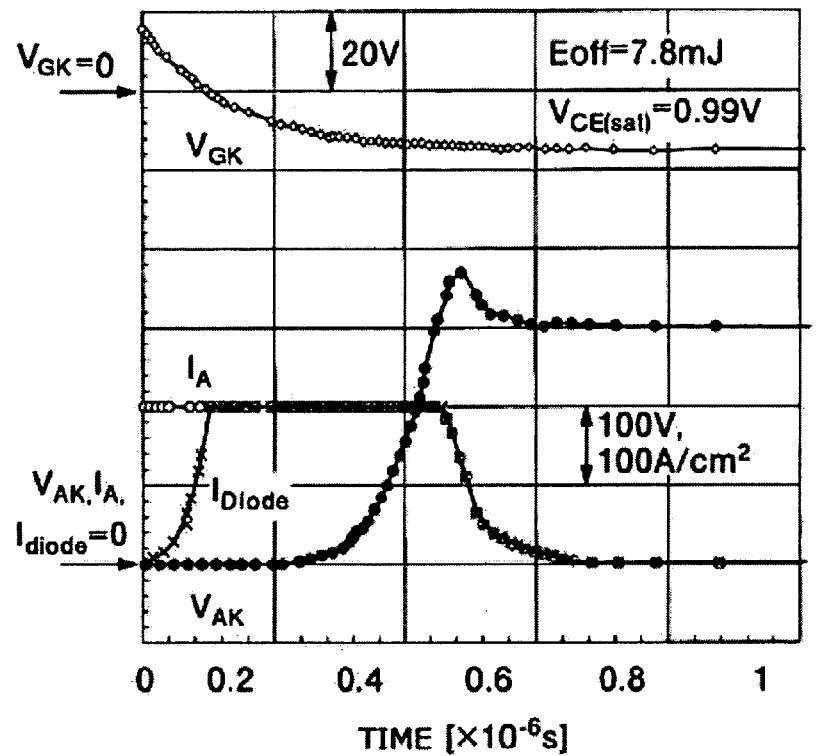
FIG. 13 is a waveform diagram showing a turn-off waveform of a semiconductor system according to embodiment 1 of the invention.
Figure 14:
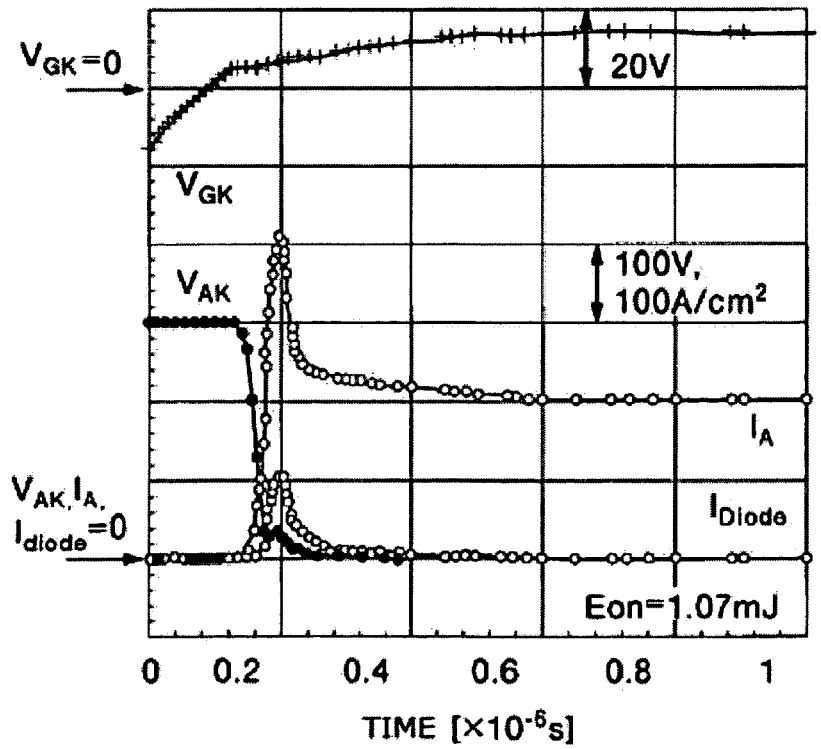
FIG. 14 is a waveform diagram showing a turn-on waveform of a semiconductor system according to embodiment 1 of the invention.
Figure 18:
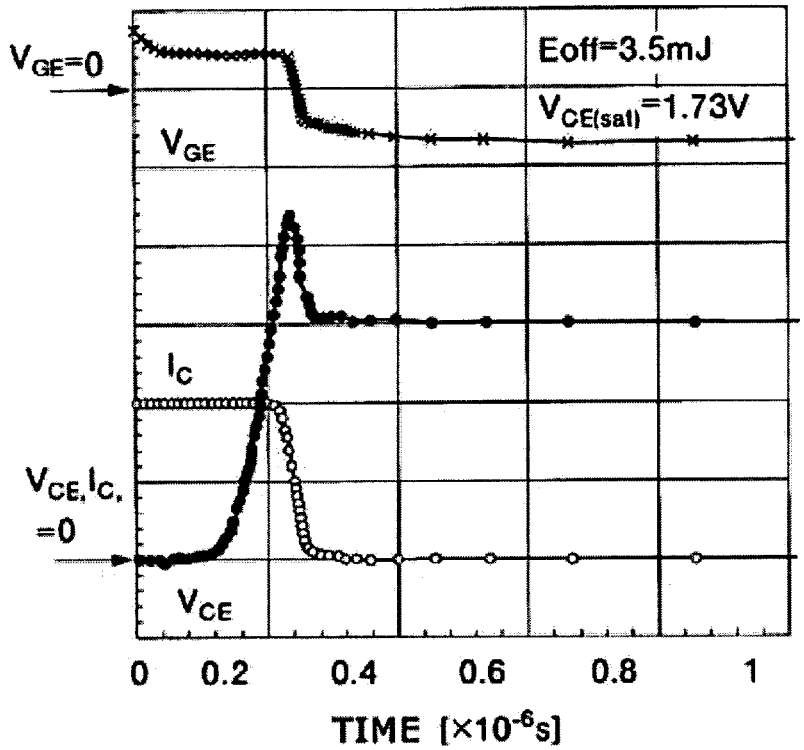
FIG. 18 is a waveform diagram showing a turn-off waveform of an existing FS-IGBT.
Figure 19:
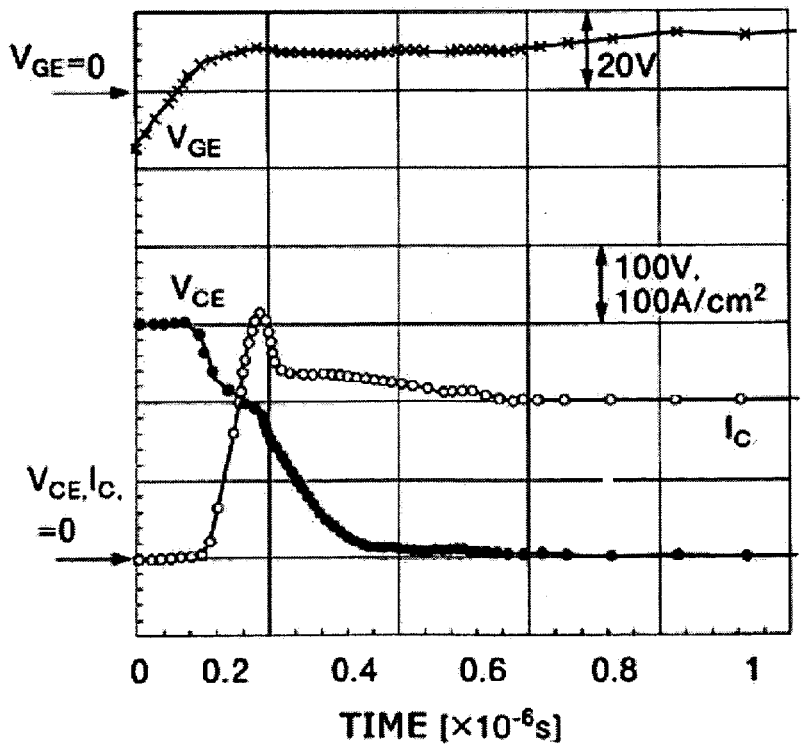
FIG. 19 is a waveform diagram showing a turn-on waveform of an existing FS-IGBT.

In FIGS. 13 and 14, respectively, turn-off waveforms and turn-on waveforms of the devices according to the first example of 600 V class are shown. For comparison purpose, in FIGS. 18 and 19, respectively, turn-off waveforms and turn-on waveforms of 600 V class FS-IGBTs having an existing partial trench structure are shown. Furthermore, in FIGS. 15 and 16, respectively, trade-off curves of saturation voltage-turn-off loss and trade-off curves of saturation voltage-switching loss of the devices according to the first example of 600 V class are shown. For comparison purposes, in FIGS. 15 and 16, similar trade-off characteristics of 600 V class FS-IGBTs having an existing partial trench structure are shown. The switching loss is a sum total of the turn-off loss and the turn-on loss. In these figures (FIGS. 13-19), $V_{gk}$ is the voltage between the gate and the cathode, Eoff is the energy loss at turn-off (current×voltage×time), $V_{ce(sat)}$ is the saturation voltage of the IBGT (voltage between the collector and the emitter of the IBGT at constant current), $V_{AK}$ is the voltage between the anode and the cathode, $I_A$ is the current passing through the anode, $I_{Diode}$ is the current passing through the diode, Eon is the energy loss at turn-on (current×voltage×time), $I_C$ is the collector current and $V_{GE}$ is the voltage between the gate and the emitter.

Figure 15:
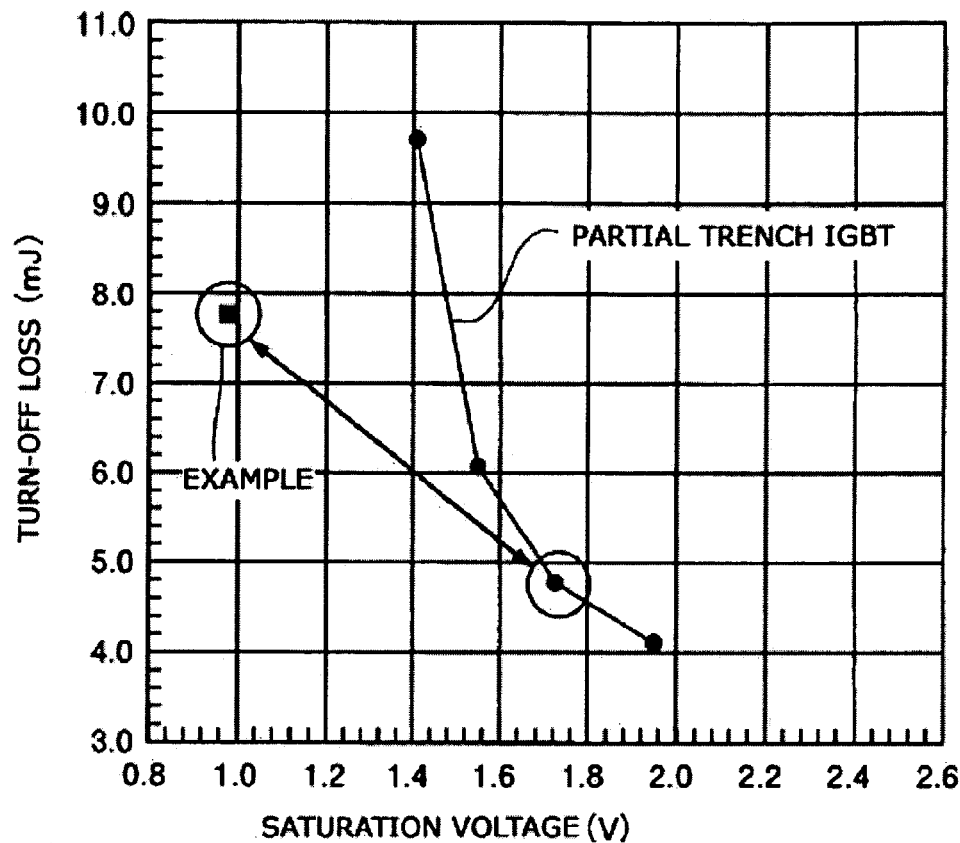
FIG. 15 is a characteristic diagram showing the trade-off characteristics between saturation voltage and turn-off loss of a semiconductor system according to embodiment 1 of the invention.
Figure 16:
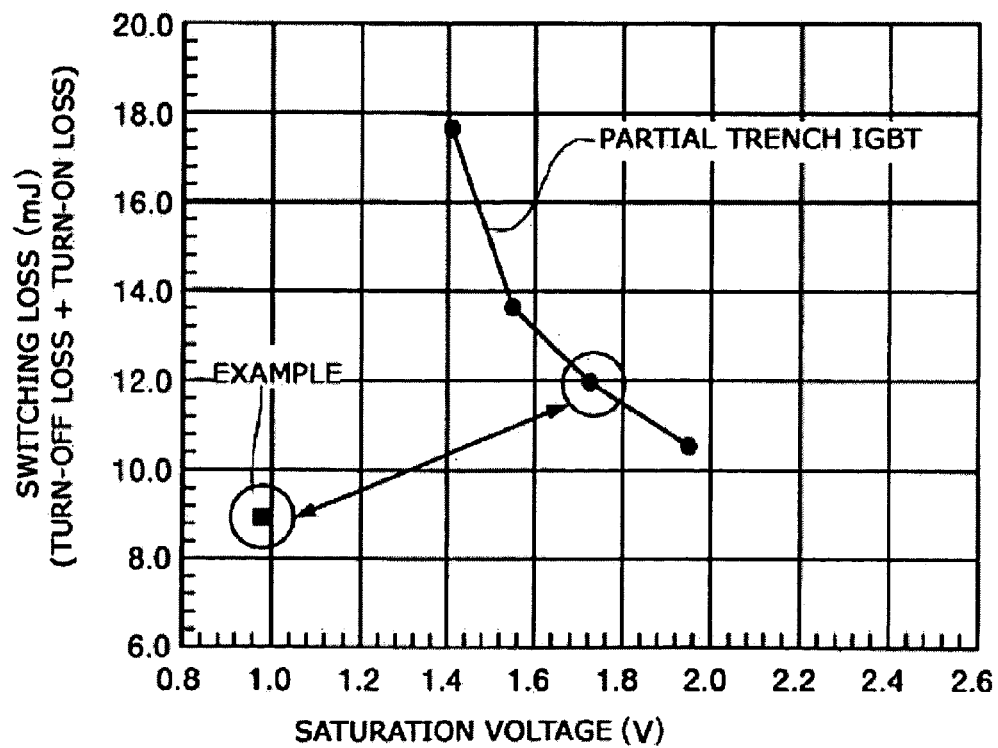
FIG. 16 is a characteristic diagram showing the trade-off characteristics of saturation voltage-switching loss of a semiconductor system according to embodiment 1 of the invention.

In each of FIGS. 15 and 16, the two encircled plot points linked by a double-headed arrow are for cases where formation conditions, such as impurity profiles of the buffer layer 19 and the anode layer 20 that constitute the thyristor portion of the first example and formation conditions such as the impurity profiles of the buffer layer and the collector layer of the FS-IGBT having an existing partial trench structure, are equal. The turn-off waveforms in FIGS. 13 and 18, and the turn-on waveforms of FIGS. 14 and 19, respectively, are for devices that are formed under conditions the same as those of the encircled plot points in FIGS. 15 and 16. The devices according to the first example can be turned on and turned off and, in comparison with the IGBT of the transistor operation, can operate as a thyristor in a practical portion where the rated current is, for instance, substantially 200 A/cm$^2$. Furthermore, the device according to the first example has a low saturation voltage and exhibits excellent trade-off characteristics.

Figure 17:
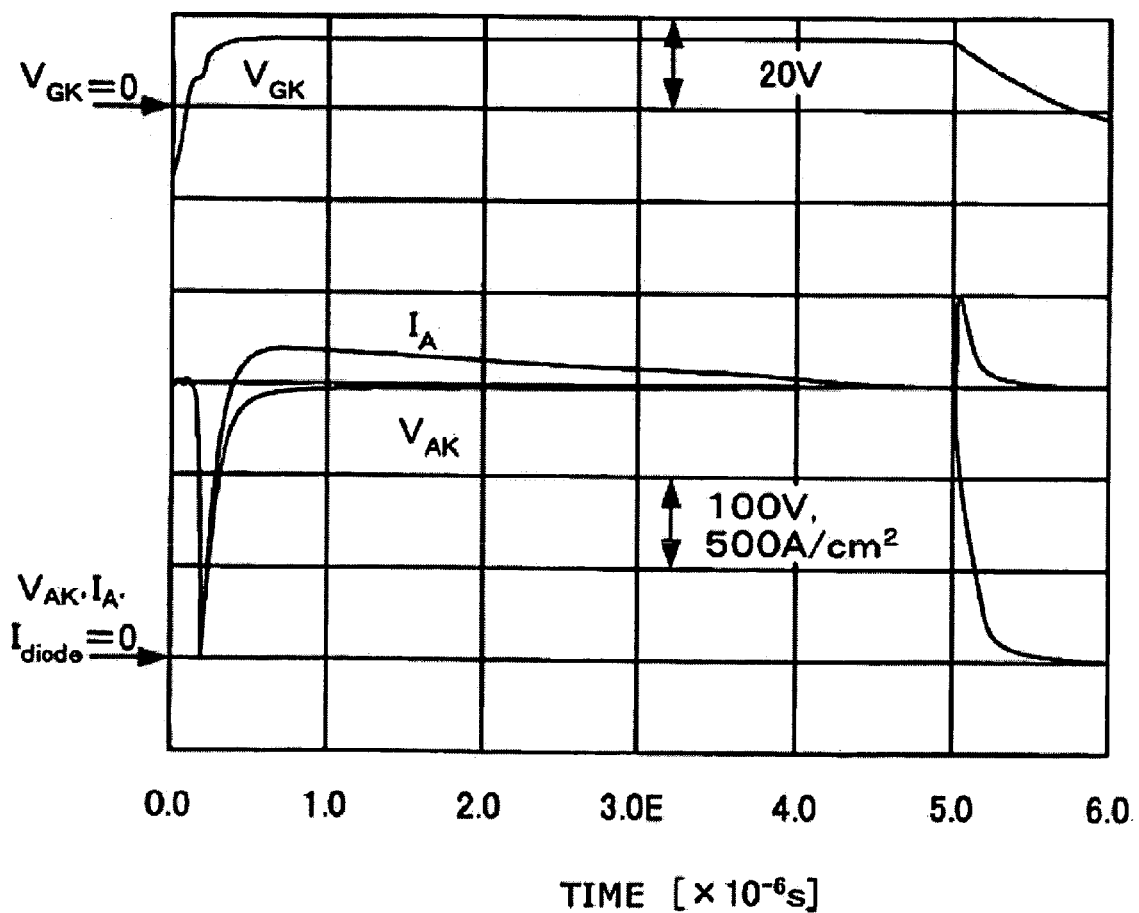
FIG. 17 is a waveform diagram showing a load short circuit waveform of a semiconductor system according to embodiment 1 of the invention.

In FIG. 17, load short circuit waveforms of the device according to the first example of 600 V class are shown. As shown in FIGS. 8 and 9, since the device according to the first example has current saturation characteristics up to a high voltage, it is found from FIG. 17 that even in the short circuit state of a power supply voltage of 300 V, the current can be interrupted without destroying the device.

Embodiment 2

Figure 20:
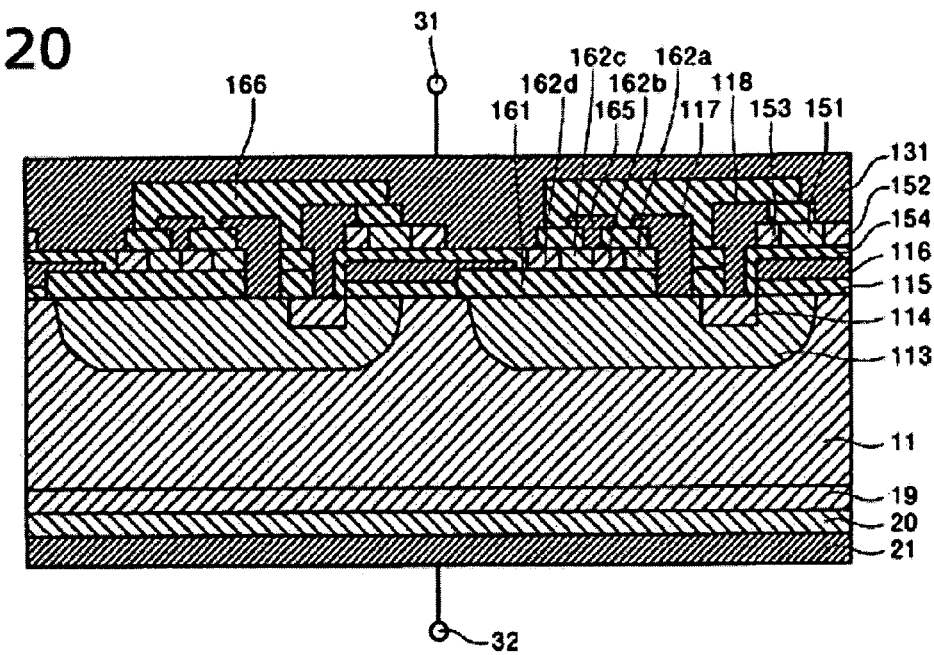
FIG. 20 is a vertical sectional diagram showing a sectional configuration of a semiconductor system according to embodiment 2 of the invention.

FIG. 20 is a vertical sectional view showing a sectional configuration of a semiconductor system according to embodiment 2 of the invention. As shown in FIG. 20, in a surface layer of an N-type semiconductor substrate 11, a P-type well region 113 is selectively disposed. An N-type cathode region (emitter region) 114 is selectively disposed in a surface layer in the well region 113. A gate insulating film 115 made of, for instance, an oxide film is disposed on a region where a channel is formed between the cathode region 114 and semiconductor substrate 11 of the well region 113. A gate electrode 116 that is a control electrode is disposed on the gate insulating film 115.

A gate insulating film 154 is disposed on the gate electrode 116. On the gate insulating film 154, an N-type source region 152 and an N-type drain region 153 are provided with a P-type semiconductor region 151 interposed therebetween and brought into contact therewith. The semiconductor region 151, the source region 152 and the drain region 153 can be formed by separately implanting for instance arsenic (As) ions as an N-type impurity, and, for instance, boron (B) ions as a P-type impurity in polysilicon formed on, for instance, the gate insulating film 154. The drain region 153 is electrically connected to the cathode region 114 through a cathode electrode 118 (emitter electrode). The semiconductor region 151 and source region 152 are electrically connected to a primary electrode (hereinafter, referred to as primary cathode electrode) 131 on a cathode side connected to the cathode terminal 31.

Furthermore, an insulating film 161 such as an oxide film is disposed on a region in the well region 113 and apart from the cathode region 114. It may be noted that the gate electrodes extends through the insulating films 115, 154 and 161. On the insulating film 161, P-type anode regions 162a and 162c and N-type cathode regions 162b and 162d are alternately disposed. The P-type anode regions 162a and 162c and N-type cathode regions 162b and 162d can be formed by separately implanting, for instance arsenic (As) ions as an N-type impurity, and, for instance, boron (B) ions as a P-type impurity, in polysilicon formed on the insulating film 161. The anode region 162a is electrically connected through a well electrode (first well electrode) 117 to the well region 113. The cathode region 162b is in contact with the anode region 162a. The cathode region 162b and anode region 162c are in contact with a floating electrode 165. The cathode region 162d is in contact with the anode region 162c and electrically connected to the primary cathode electrode 131.

The drain region 153, the cathode electrode 118, the well electrode 117, the floating electrode 165, the anode regions 162a and 162c, and the cathode region 162b are insulated from the primary cathode electrode 131 with an insulating film 166 that covers the abovementioned regions and electrodes. Furthermore, the cathode electrode 118, the well electrode 117 and the floating electrode 165 also are insulated from each other. Similarly to the configuration of the thyristor according to the embodiment 1, the N-type buffer layer 19, the P-type anode layer (well layer) 20, and the anode electrode (second well electrode) 21 are disposed on a back surface side of the semiconductor substrate 11. The anode electrode 21 is connected to an anode terminal 32.

An equivalent circuit of the semiconductor system shown in FIG. 20 is the same as that of the circuit shown in FIG. 7. The correspondence between the equivalent circuit shown in FIG. 7 and a device structure shown in FIG. 20 is as follows. The PNP transistor 44 is constituted of a P layer of an anode layer 20, an N layer made of the buffer layer 19 and the semiconductor substrate 11, and a P layer of the well region. 113. The NPN transistor 45 is constituted of an N layer of the semiconductor substrate 11, a P layer of the well region 113 and an N layer of the cathode region 114. The second MOSFET 46 is constituted of the cathode region 114, the well region 113, the semiconductor substrate 11, the gate insulating film 115 and the gate electrode 116.

The source region 152, the semiconductor region 151, the drain region 153, the gate insulating film 154 and the gate electrode 116 correspond to the first MOSFET 41. Thus, in the embodiment 2, the first and second MOSFETs 41 and 46 have the gate electrode 116 in common. By thus configuring the system, the number of steps during manufacture can be reduced. The anode regions 162a and 162c, the cathode regions 162b and 162d and the floating electrode 165 correspond to the diode 42a. The number of serially connected diodes is not restricted to two. An operation of the semiconductor system according to the embodiment 2 is the same as that of the embodiment 1; accordingly, a description thereof is being omitted.

Embodiment 3

Figure 21:
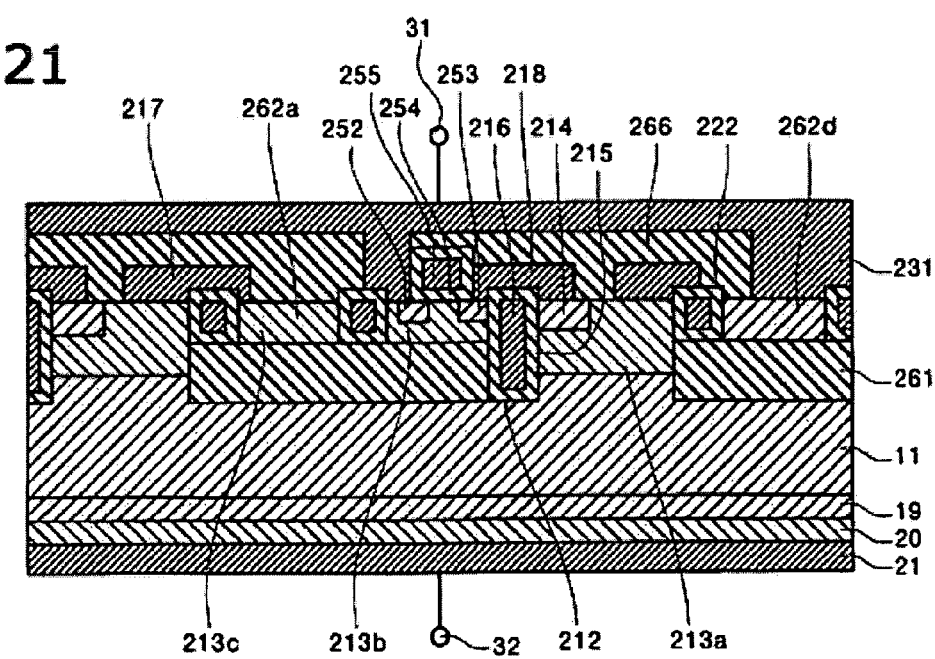
FIG. 21 is a vertical sectional view showing a sectional configuration of a semiconductor system according to embodiment 3 of the invention.
Figure 22:
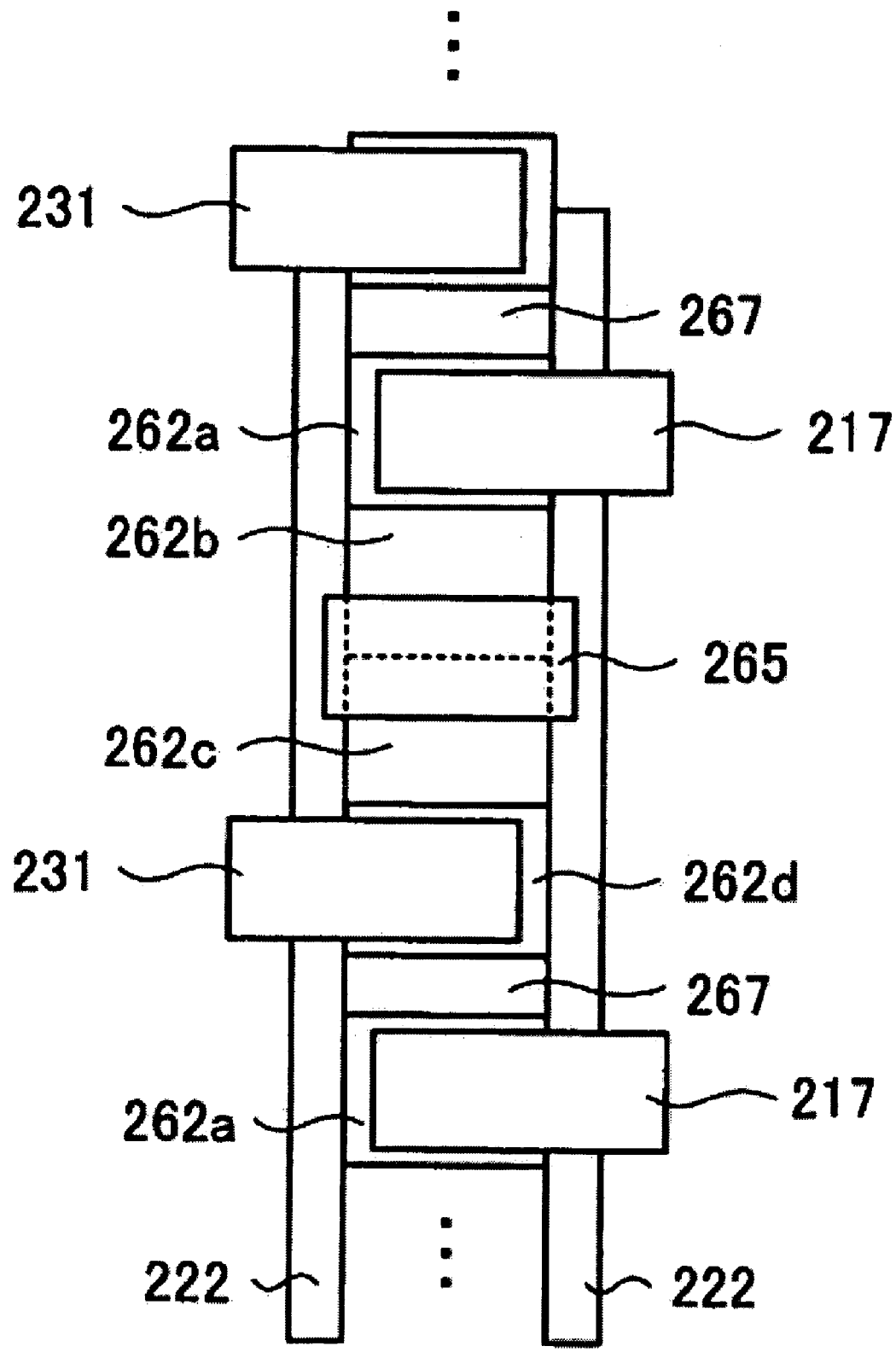
FIG. 22 is a partial plan view showing a configuration of a diode of a semiconductor system according to embodiment 3 of the invention.

FIG. 21 is a vertical sectional view showing a sectional configuration of a semiconductor system according to embodiment 3 of the invention. FIG. 22 is a partial plan view showing an essential configuration of a diode of a semiconductor system according to embodiment 3 of the invention. As shown in FIG. 21, inside of an N-type semiconductor substrate 11, a buried oxide film 261 is selectively disposed. Furthermore, P-type well regions 213a, 213b and 213c are selectively disposed on a surface layer of the semiconductor substrate 11. Among these, well regions 213b and 213c are disposed on the buried oxide film 261.

The well regions 213b and 213c, and the well regions 213c and 213a, respectively, are insulated from each other by a trench element separation portion 222 disposed on the buried oxide film 261. The well regions 213a and 213b are insulated from each other by a trench groove 212 that is formed selectively on the surface layer of the semiconductor substrate 11 and deeper than the well region 213a. Then, on a surface layer within the well region 213a that is in contact with the semiconductor substrate 11, an N-type cathode region (emitter region) 214 is selectively disposed in contact with a sidewall of the trench groove 212. Inside of the trench groove 212 is buried a gate electrode (control electrode) 216 through a gate insulating film 215 made of, for instance, an oxide film.

On a surface layer of one well region 213b on the buried oxide film 261, an N-type drain region 253 is selectively disposed in contact with a sidewall of the trench groove 212, and an N-type source region 252 is selectively disposed detached from the trench groove 212. The drain region 253 is electrically connected by a cathode electrode 218 (emitter electrode) to the cathode region 214. The source region 252 is electrically connected to the primary cathode electrode 231 connected to the cathode terminal 31. A gate electrode 255 is disposed on a region where a channel is formed between the source region 252 and the drain region 253 of the well region 213b, through a gate insulating film 254 made of, for instance, an oxide film.

The other well region 213c on the buried oxide film 261 is the anode region 262a, 262c or the cathode region 262b, 262d. The anode region 262a, 262c is formed by implanting, for instance, boron (B) ions as a P-type impurity in the well region 213c. The cathode region 262b, 262d is formed by implanting, for instance, arsenic (As) ions as an N-type impurity in the well region 213c.

The anode regions 262a and 262c and cathode regions 262b and 262d are alternately disposed in a depth direction relative to FIG. 21 in such an order of the anode region 262a, the cathode region 262b, the anode region 262c and the cathode region 262d (FIG. 22). In FIG. 21, the anode region 262a and the cathode region 262d are shown. The anode region 262a is electrically connected through the well electrode (first well electrode) 217 to the well region 213a. The cathode region 262d is electrically connected to the primary cathode electrode 231.

The cathode electrode 218, the well electrode 217, the well region 213a, the anode regions 262a and 262c, and the cathode region 262b are insulated from the primary cathode electrode 231 with an insulating film 266 that covers the abovementioned regions and electrodes. Furthermore, the cathode electrode 218 and the well electrode 217 are also insulated from each other with the insulating film 266. An N-type buffer layer 19, a P-type anode layer (well layer) 20 and an anode electrode (second well electrode) 21 are disposed on a back surface side of the semiconductor substrate 11, similarly to the configuration of the thyristor according to the embodiment 1. The anode electrode 21 is connected to an anode terminal 32.

The anode regions 262a and 262c and the cathode regions 262b and 262d are disposed in a planar arrangement, as follows. As shown in FIG. 22, the cathode region 262b is in contact with the anode region 262a. The cathode region 262b and the anode region 262c are in contact with the floating electrode 265. The cathode region 262d is in contact with the anode region 262c. With this one sequence as a unit block, a plurality of unit blocks is disposed with an insulating region 267 interposed therebetween. Though omitted in FIG. 22, the floating electrode 265, the cathode electrode 218 and the well electrode 217 are insulated from each other. Furthermore, the floating electrode 265 is insulated from the primary cathode electrode 231 by means of the insulating film 266.

An equivalent circuit of a semiconductor system having a configuration shown in FIGS. 21 and 22 is the same as that of the circuit shown in FIG. 7. Correspondence between the equivalent circuit shown in FIG. 7 and a device structure shown in FIGS. 21 and 22 is as follows. A PNP transistor 44 is constituted of a P layer of an anode layer 20, an N layer made of a buffer layer 19 and a semiconductor substrate 11, and a P layer made of the well region 213a. An NPN transistor 45 is constituted of an N layer of the semiconductor substrate 11, a P layer of the well region 213a and an N layer of the cathode region 214. The second MOSFET 46 is constituted of the cathode region 214, the well region 213a, the semiconductor substrate 11, the gate insulating film 215 and the gate electrode 216.

The source region 252, the well region 213b, the drain region 253, the gate insulating film 254 and the gate electrode 255 correspond to the first MOSFET 41. The anode regions 262a and 262c, the cathode regions 262b and 262d and the floating electrode 265 correspond to the diode 42a. The number of serially connected diodes is not restricted to two. The operation of the semiconductor system according to the embodiment 3 is the same as that of the embodiment 1; accordingly, a description thereof has been omitted.

Embodiment 4

Figure 23:
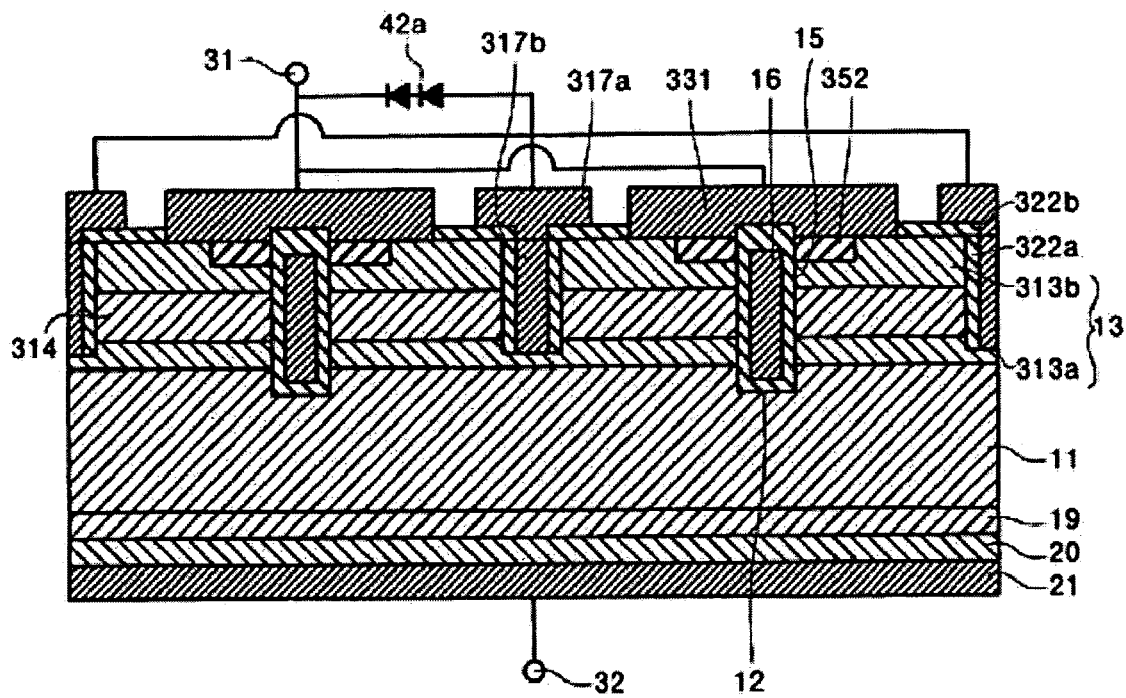
FIG. 23 is a vertical sectional diagram showing a sectional configuration of a semiconductor system according to embodiment 4 of the invention.

FIG. 23 is a vertical sectional view showing a sectional configuration of a semiconductor system according to an embodiment 4 of the invention. As shown in FIG. 23, on a surface layer of an N-type semiconductor substrate 11, a trench groove 12 is selectively formed. On a surface layer of the semiconductor substrate 11 and in contact with a sidewall of the trench groove 12, a P-type well region 13 shallower than the trench groove 12 is selectively disposed. Furthermore, an N-type source region 352 is selectively disposed on a surface layer within the well region 13 and in contact with a sidewall of the trench groove 12.

Furthermore, an N-type cathode region 314 is disposed within the well region 13 in contact with a sidewall of the trench groove 12. The cathode region 314 divides the well region 13 into a first well portion 313a that is in contact with the semiconductor substrate 11 and a second well portion 313b that is not in contact with the semiconductor substrate 11. Furthermore, the cathode region 314 and the source region 352 are distanced from each other.

A gate electrode 16 that is a control electrode is disposed through a gate insulating film 15 made of an oxide film or the like that partially covers, along the sidewall of the trench groove 12, the source region 352, the second well portion 313b, the cathode region 314 and the first well portion 313a. A cathode electrode (emitter electrode) 331 is electrically connected to the source region 352 and second well portion 313b. The cathode electrode 331 is connected to a cathode terminal 31.

The well electrode 317a is electrically connected to the first well portion 313a through a trench plug 317b disposed at a position apart from the source region 352. The well electrode 317a and the trench plug 317b are insulated from the second well portion 313b and the cathode region 314 with insulating films 322a and 322b such as an oxide film or the like. The well electrode 317a is connected to the anode 63 of the diode 42a, the diode 42a having a configuration for instance as shown in FIG. 4.

The cathode electrode 64 of the diode 42a is connected to the cathode terminal 31. That is, the diode 42a, of which the cathode electrode 331 side is an anode, is connected between the cathode electrode 331 and the well electrode 317a. On a back surface side of the semiconductor substrate 11, similarly to the configuration of the thyristor according to embodiment 1, an N-type buffer layer 19, a P-type anode layer 20 and an anode electrode 21 are disposed. The anode electrode 21 is connected to the anode terminal 32.

Here, an impurity concentration, highest in a portion interposed between the source region 352 and the cathode region 314 and contacting a sidewall of the trench groove 12 of the well region 13, is expressed with $C_{s-k}$. Furthermore, an impurity concentration, highest in a portion that is in contact with a sidewall of the trench groove 12 of the well region 13 and interposed between the cathode electrode 331 and the semiconductor substrate 11, is expressed with $C_{k-b}$. In the present embodiment 4, $C_{s-k} \leq C_{k-b}$ is satisfied.

An equivalent circuit of a semiconductor system having the configuration shown in FIG. 23 is the same as that of the circuit shown in FIG. 7. The correspondence between the equivalent circuit shown in FIG. 7 and a device structure shown in FIG. 23 is as follows. A PNP transistor 44 is constituted of a P layer of the anode layer 20, an N layer made of the buffer layer 19 and the semiconductor substrate 11, and a P layer made of the first well portion 313a. An NPN transistor 45 is constituted of an N layer of the semiconductor substrate 11, a P layer of the first well portion 313a and an N layer of the cathode region 314. A second MOSFET 46 is constituted of the cathode region 314, the first well region 313a, the semiconductor substrate 11, the gate insulating film 15 and the gate electrode 16.

The source region 352, the second well portion 313b, the cathode region 314, the gate insulating film 15 and the gate electrode 16 correspond to a first MOSFET 41. The diode, without being restricted to the two series configuration, may be one having a configuration shown in FIG. 5 or 6. An operation of the semiconductor system according to the embodiment 4 is the same as that of the embodiment 1; accordingly, a description thereof is omitted.

Embodiment 5

Figure 24:
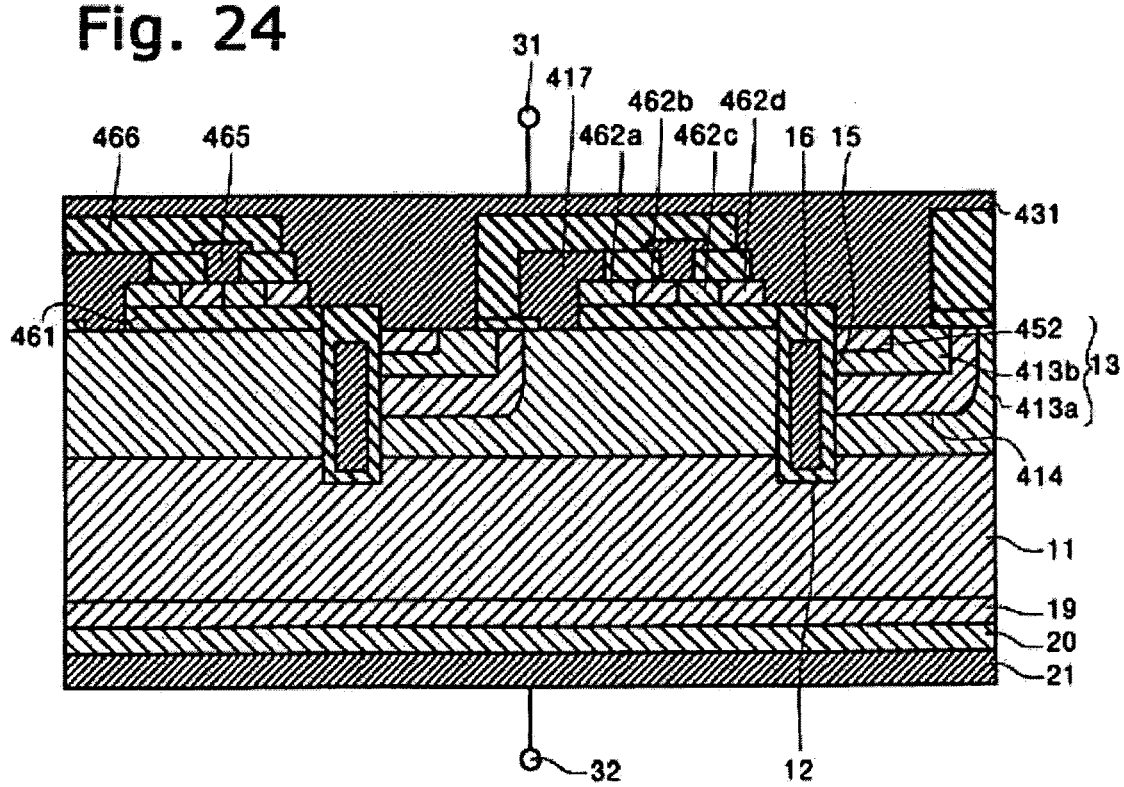
FIG. 24 is a vertical sectional diagram showing a sectional configuration of a semiconductor system according to embodiment 5 of the invention.

FIG. 24 is a vertical sectional view showing a sectional configuration of a semiconductor system according to an embodiment 5 of the invention. As shown in FIG. 24, disposed on a surface layer of an N-type semiconductor substrate 11, similarly to embodiment 4, is a trench gate structure in which, in a trench groove 12, a gate electrode 16 is buried surrounded by a gate insulating film 15. Furthermore, a P-type well region 13 shallower than the trench groove 12 is disposed in contact with a sidewall of the trench groove 12 and on a surface layer of the semiconductor substrate 11.

The well region 13 is divided into a first well portion 413a and a second well portion 413b by an N-type cathode region 414 that is in contact with the sidewall of the trench groove 12. The first well portion 413a is in contact with the semiconductor substrate 11 and partially exposed on a surface of the substrate. The second well portion 413b is not in contact with the semiconductor substrate 11. An N-type source region 452 is selectively disposed in contact with the sidewall of the trench groove 12 and on a surface layer in the second well portion 413b. The source region 452 and the second well portion 413b are electrically connected to a primary cathode electrode (emitter electrode) 431 connected to a cathode terminal 31.

P-type anode regions 462a and 462c and N-type cathode regions 462b and 462d are alternately disposed on a portion exposed on a surface of the substrate of the first well portion 413a, through an insulating film 461 such as an oxide film or the like. The anode regions 462a and 462c and N-type cathode regions 462b and 462d are formed by separately implanting, for instance, arsenic (As) ions as an N-type impurity and, for instance, boron (B) ions as a P-type impurity, in polysilicon formed on the insulating film 461. The anode region 462a is electrically connected through the well electrode 417 to the first well portion 413a. The cathode region 462b is in contact with the anode region 462a. The cathode region 462b and the anode region 462c are in contact with a floating electrode 465. The cathode region 462d is in contact with the anode region 462c and electrically connected to the primary cathode electrode 431.

The well electrode 417, the floating electrode 465, the anode regions 462a and 462c and the cathode region 462b are insulated from the primary cathode electrode 431 by means of an insulating film 466 that covers the abovementioned regions and electrodes. Furthermore, the well electrode 417 and the floating electrode 465 are also insulated from each other. An N-type buffer layer 19, a P-type anode layer 20 and an anode electrode 21 are disposed on a back surface side of the semiconductor substrate 11, similarly to a configuration of the thyristor according to the embodiment 1. The anode electrode 21 is connected to an anode terminal 32.

Here, an impurity concentration, highest in a portion that is in contact with a sidewall of a trench groove 12 of the well region 13 and interposed between the source region 452 and the cathode region 414, is expressed with $C_{s-k}$. Furthermore, an impurity concentration, highest in a portion that is in contact with the sidewall of the trench groove 12 of the well region 13 and interposed between the primary cathode electrode 431 and the semiconductor substrate 11, is expressed with $C_{k-b}$. In the present embodiment 5, $C_{s-k} \leq C_{k-b}$ is satisfied.

An equivalent circuit of a semiconductor system having a configuration shown in FIG. 24 is the same as that of the circuit shown in FIG. 7. Correspondence between the equivalent circuit shown in FIG. 7 and a device structure shown in FIG. 24 is as follows. A PNP transistor 44 is constituted of a P layer of an anode layer 20, an N layer made of a buffer layer 19 and the semiconductor substrate 11, and a P layer made of the first well portion 413a. An NPN transistor 45 is constituted of an N layer of the semiconductor substrate 11, a P layer of the first well portion 413a and an N layer of the cathode region 414. A second MOSFET 46 is constituted of the cathode region 414, the first well region 413a, the semiconductor substrate 11, the gate insulating film 15 and the gate electrode 16.

The source region 452, the second well portion 413b, the cathode region 414, the gate insulating film 15 and the gate electrode 16 correspond to a first MOSFET 41. The anode regions 462a and 462c, the cathode regions 462b and 462d, and the floating electrode 465 correspond to a diode 42a. The number of serially connected diodes is not restricted to two. An operation of the semiconductor system according to the embodiment 5 is the same as that of the embodiment 1; accordingly, a description thereof is omitted.

Embodiment 6

Figure 25:
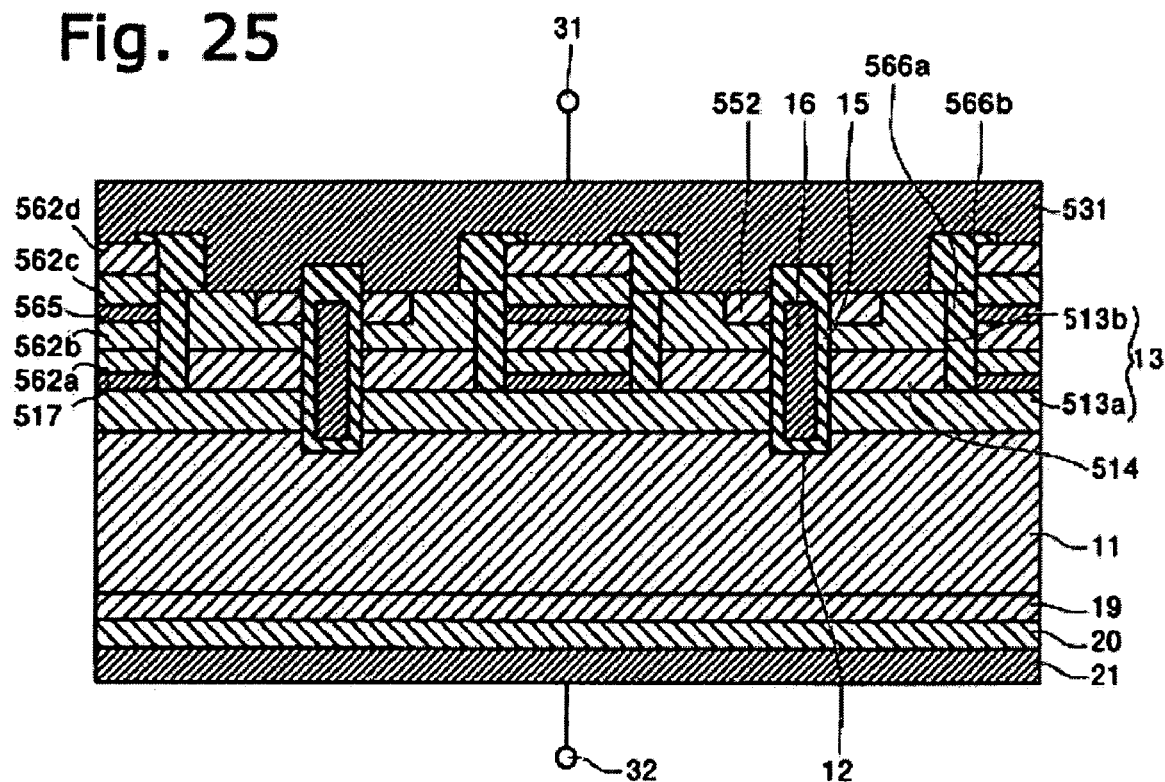
FIG. 25 is a vertical sectional diagram showing a sectional configuration of a semiconductor system according to embodiment 6 of the invention.

FIG. 25 is a vertical sectional view showing a sectional configuration of a semiconductor system according to embodiment 6 of the invention. As shown in FIG. 25, on a surface layer of an N-type semiconductor substrate 11, a trench gate structure made of a trench groove 12, a gate insulating film 15 and a gate electrode 16 and a P-type well region 13 shallower than the trench groove 12 are formed. The well region 13, similarly to the embodiment 4, is divided with an N-type cathode region 514 into a first well portion 513a that is in contact with the semiconductor substrate 11 and a second well portion 513b that is not in contact with the semiconductor substrate 11.

An N-type source region 552 is selectively disposed in contact with a sidewall of the trench groove 12 and on a surface layer in the second well portion 513b. The source region 552 and the second well portion 513b are electrically connected to a primary cathode electrode (emitter electrode) 531 connected to a cathode terminal 31. A well electrode 517, a P-type anode region 562a, an N-type cathode region 562b, a floating electrode 565, a P-type anode region 562c and an N-type cathode region 562d are disposed in a bottom-up manner at a position detached from the source region 552, on the first well portion 513a.

The anode region 562a is electrically connected through the well electrode 517 to the first well portion 513a. The cathode region 562b is in contact with the anode region 562a and the floating electrode 565. The anode region 562c is in contact with the floating electrode 565. The cathode region 562d is in contact with the anode region 562c and electrically connected to the primary cathode electrode 531.

The anode regions 562a and 562c, the cathode region 562b, the floating electrode 565 and the well electrode 517 are insulated from the cathode region 514, the second well portion 513b and the primary cathode electrode 531 by use of insulating films 566a and 566b that surround peripheries of the abovementioned regions and electrodes. On a back surface side of the semiconductor substrate 11, similarly to a configuration of the thyristor according to the embodiment 1, an N-type buffer layer 19, a P-type anode layer 20 and an anode electrode 21 are disposed. The anode electrode 21 is connected to an anode terminal 32.

Here, an impurity concentration, highest in a portion that is in contact with the sidewall of the trench groove 12 of the well region 13 and interposed between the source region 552 and the cathode region 514, is expressed with $C_{s-k}$, and an impurity concentration, highest in a portion that is in contact with the sidewall of the trench groove 12 of the well region 13 and interposed between the primary cathode electrode 531 and the semiconductor substrate 11, is expressed with $C_{k-b}$. In the present embodiment 6, $C_{s-k} \leq C_{k-b}$ is satisfied.

An equivalent circuit of a semiconductor system having a configuration shown in FIG. 25 is the same as that of the circuit shown in FIG. 7. Correspondence between the equivalent circuit shown in FIG. 7 and a device structure shown in FIG. 25 is as follows. A PNP transistor 44 is constituted of a P layer of an anode layer 20, an N layer made of a buffer layer 19 and the semiconductor substrate 11, and a P layer made of the first well portion 513a. An NPN transistor 45 is constituted of an N layer of the semiconductor substrate 11, a P layer of the first well portion 513a and an N layer of the cathode region 514. A second MOSFET 46 is constituted of the cathode region 514, the first well region 513a, the semiconductor substrate 11, the gate insulating film 15 and the gate electrode 16.

The source region 552, the second well portion 513b, the cathode region 514, the gate insulating film 15 and the gate electrode 16 correspond to a first MOSFET 41. The anode regions 562a and 562c, the cathode regions 562b and 562d and the floating electrode 565 correspond to a diode 42a. The number of serially connected diodes is not restricted to two. An operation of the semiconductor system according to the embodiment 6 is the same as that of the embodiment 1; accordingly, a description thereof is omitted.

Embodiment 7

Figure 26:
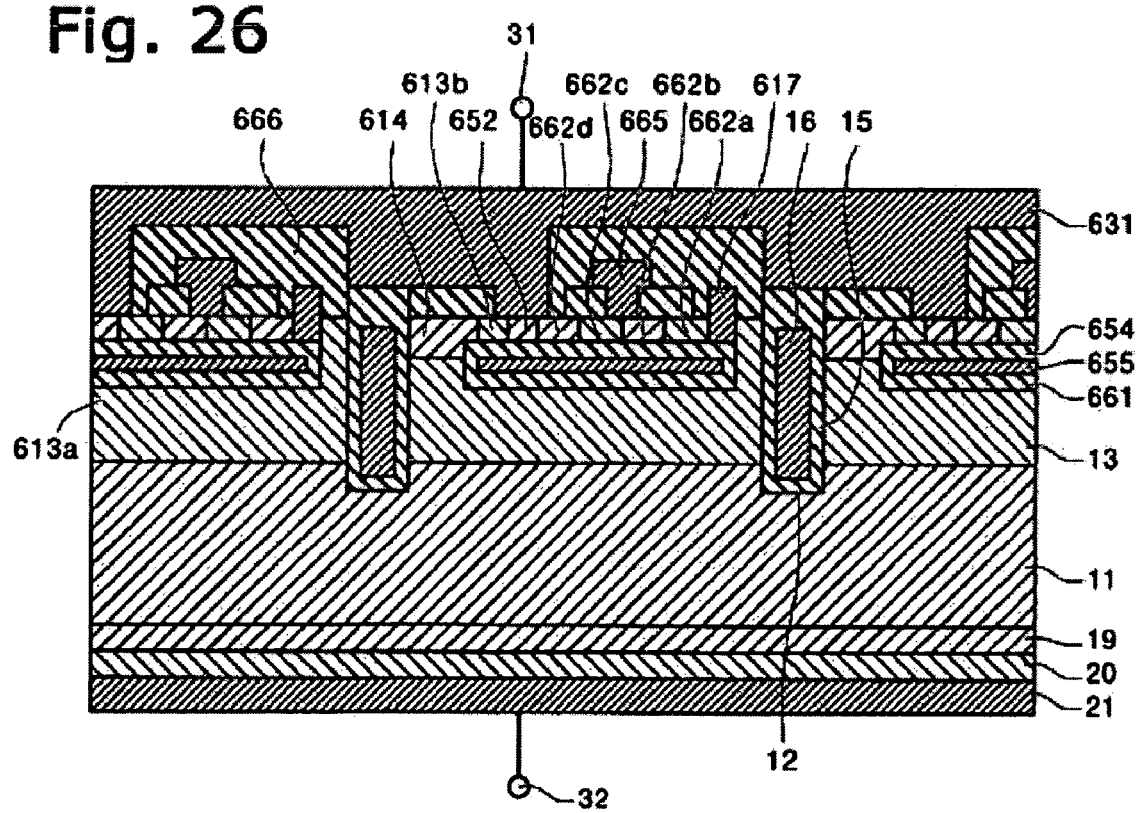
FIG. 26 is a vertical sectional diagram showing a sectional configuration of a semiconductor system according to embodiment 7 of the invention.

FIG. 26 is a vertical sectional view showing a sectional configuration of a semiconductor system according to embodiment 7 of the invention. As shown in FIG. 26, on a surface layer of an N-type semiconductor substrate 11, a trench gate structure made of a trench groove 12, a gate insulating film 15 and a gate electrode 16 and a P-type well region 13 shallower than the trench groove 12 are formed. Inside of the well region 13, a buried oxide film 661 is selectively disposed. A gate electrode 655 is disposed on the buried oxide film 661, and a gate insulating film 654 is disposed further thereabove.

The well region 13 is divided into a first well portion 613a that is in contact with the semiconductor substrate 11 and a second well portion 613b that is not contact with the semiconductor substrate 11, by use of an N-type emitter region 614 that is disposed on a surface layer of the well region 13 and in contact with a sidewall of the trench groove 12 and by use of a source region 652 disposed on a gate insulating film 654 apart from the emitter region 614. The source region 652 and second well portion 613b are electrically connected to a primary cathode electrode (emitter electrode) 631 that is connected to a cathode terminal 31.

Furthermore, on the gate insulating film 654, P-type anode regions 662a and 662c and N-type cathode regions 662b and 662d are alternately disposed. The P-type anode regions 662a and 662c and N-type cathode regions 662b and 662d are formed by separately implanting, for instance, arsenic (As) ions as an N-type impurity and, for instance, boron (B) ions as a P-type impurity in polysilicon formed on the gate insulating film 654. The anode region 662a is electrically connected through the well electrode 617 to the first well portion 613a. The cathode region 662b is contact with the anode region 662a. The cathode region 662b and the anode region 662c are in contact with a floating electrode 665. The cathode region 662d is in contact with the anode region 662c and electrically connected to the primary cathode electrode 631.

A well electrode 617, the floating electrode 665, the anode regions 662a and 662c and the cathode region 662b are insulated from the primary cathode electrode 631 by means of an insulating film 666 that covers the abovementioned regions and electrodes. Furthermore, the well electrode 617 and the floating electrode 665 are also insulated from each other. An N-type buffer layer 19, a P-type anode layer 20 and an anode electrode 21 are disposed on a back surface side of the semiconductor substrate 11, similarly to a configuration of the thyristor according to the embodiment 1. The anode electrode 21 is connected to an anode terminal 32.

An equivalent circuit of a semiconductor system having a configuration shown in FIG. 26 is the same as that of the circuit shown in FIG. 7. Correspondence between the equivalent circuit shown in FIG. 7 and a device structure shown in FIG. 26 is as follows. A PNP transistor 44 is constituted of a P layer of an anode layer 20, an N layer made of a buffer layer 19 and the semiconductor substrate 11, and a P layer made of the first well portion 613a. An NPN transistor 45 is constituted of an N layer of the semiconductor substrate 11, a P layer of the first well portion 613a and an N layer of the emitter region 614. A second MOSFET 46 is constituted of the emitter region 614, the first well portion 613a, the semiconductor substrate 11, the gate insulating film 15 and the gate electrode 16.

The source region 652, the second well portion 613b, the emitter region 614, the gate insulating film 654 and the gate electrode 655 correspond to a first MOSFET 41. The anode regions 662a and 662c, the cathode regions 662b and 662d, and the floating electrode 665 correspond to a diode 42a. The number of serially connected diodes is not restricted to two. An operation of the semiconductor system according to the embodiment 7 is the same as that of the embodiment 1; accordingly, a description thereof is omitted.

As explained above, according to the respective embodiments, in an on-state, the device operates as a thyristor and a carrier concentration in the vicinity of a surface of the device goes up. On the other hand, in a transient state transferring from an off-state to an on-state or a transient state transferring from an on-state to an off-state, the device operates as a bipolar transistor. Furthermore, in a state where an eddy current flows, it also operates as a bipolar transistor and thereby the current limiting function is exerted. Accordingly, while maintaining the current saturation characteristics and the short circuit capacity up to high voltages, excellent trade-off characteristics that a thyristor operation device has can be obtained; accordingly, both trade-off characteristics superior to the IGBT and a safe operation region like that of the IGBT can be simultaneously realized.

Furthermore, as shown in embodiments 2 and 3, when the IGBT portion and the diode, the IGBT portion and the first MOSFET 41, or the IGBT portion and the diode and the first MOSFET 41 are formed in close vicinity to each other, the wiring resistance and wiring inductance can be made very small; accordingly, the behavior of the device during a dynamic operation can be stabilized. Still furthermore, like embodiment 3, when the first MOSFET 41 is formed of a silicon semiconductor, since the charge mobility is larger than that of polysilicon, in comparison with a case where the first MOSFET 41 is formed from polysilicon, the on-resistance of the first MOSFET 41 can be made smaller. Accordingly, the saturation voltage of the device can be made lower.

Still furthermore, according to embodiments 4 through 6, by use of a semiconductor substrate that does not have a buried oxide film, the first MOSFET 41 can be formed on the semiconductor substrate; accordingly, the saturation voltage characteristics can be improved and the substrate cost can be reduced. However, it is necessary that the NPN transistor 45 is inhibited from operating owing to a current that flows through regions below the first well portions 313*a*, 413*a* and 513*a* and cathode regions 314, 414 and 514.

In the above, the invention, without restricting to the abovementioned respective embodiments, can be variously modified. For instance, the self arc-extinguishing device, without being restricted to a MOSFET, as far as it is a self arc-extinguishing device, may be any kind of device. Furthermore, the rectifying device also, as far as it has the rectifying properties, may be any kind of device. Still furthermore, as the rectifying device, a diode can be connected with the polarity reversed to that of the abovementioned respective embodiments, and, owing to the withstand voltage of the diode, a current that flows from an anode to a cathode may be rectified.

As mentioned above, the semiconductor systems according to the invention are useful for a power semiconductor device or a circuit formation of a power semiconductor device, and particularly suitable for a voltage drive-type thyristor.

What is claimed is:

1. A semiconductor system, comprising:
   an insulating gate bipolar transistor including a well region of a second conductivity-type selectively disposed on a surface layer of a semiconductor substrate, the substrate of a first conductivity-type; an emitter region of the first conductivity-type, selectively disposed on a surface layer in the well region; an insulating film that partially covers the well region and the emitter region; a control electrode extending through the insulating film; a first well electrode electrically connected to the well region; an emitter electrode electrically connected to the emitter region; a well layer of the second conductivity-type disposed on a back surface side of the substrate; and a second well electrode electrically connected to the well layer;
   a first terminal;
   a self arc-extinguishing device connected between the emitter electrode and the first terminal;
   a rectifying device connected between the first well electrode and the first terminal; and
   a second terminal connected to the second well electrode;
   wherein the insulating gate bipolar transistor, when a current that flows between the first and second terminals is small, operates as a thyristor, and when the current is large, operates as a bipolar transistor, and
   wherein the insulating gate bipolar transistor automatically switches between a state in which it operates as a thyristor and a state in which it operates as a bipolar transistor, based on the current.

2. The semiconductor system according to claim 1, wherein, denoting the current that flows in the semiconductor system between the first and second terminals as I, a rated current of the semiconductor system as $I_{rate}$, a voltage drop when the current I flows only to the self arc-extinguishing device as $V_M$, and a voltage drop when the current I flows only to the rectifying device as $V_D$, the current-voltage characteristics of the self arc-extinguishing device and the rectifying device satisfy $V_M+0.6\ V<V_D$ when $I<2\times I_{rate}$, and $V_M>V_D$ when $I>2\times I_{rate}$.

3. The semiconductor system according to claim 1, wherein when the current is equal to or less than a limiting current value of the semiconductor system and the well electrode and the emitter electrode are short-circuited, the insulating gate bipolar transistor operates as a transistor.

4. The semiconductor system according to claim 1, wherein when the current that flows between the first and second terminals has a flow rate equal to that of a limiting current of the semiconductor system, an amount of voltage drop is equal to or less than a withstand voltage of the self arc-extinguishing device.

5. The semiconductor system according to claim 1, wherein the self arc-extinguishing device is an insulating gate field effect transistor.

6. The semiconductor system according to claim 5, wherein a threshold value of the insulating gate field effect transistor is higher than a threshold value of the insulating gate bipolar transistor.

7. The semiconductor system according to claim 5, wherein a limiting current value of the insulating gate field effect transistor is larger than a limiting current value of the insulating gate bipolar transistor.

8. The semiconductor system according to claim 5, wherein the control electrode is electrically connected to a control electrode of the insulating gate field effect transistor.

9. The semiconductor system according to claim 5, wherein when the semiconductor system is in an on-state the insulating gate field effect transistor does not operate in a saturation region.

10. The semiconductor system according to claim 1, wherein the rectifying device is a diode, and wherein when a rated current flows in a forward direction between the second and first terminals of the semiconductor system, a significant current does not flow through the diode in a forward or backward direction of the diode.

11. The semiconductor system according to claim 1, wherein the rectifying device is a diode, a positive electrode of the diode is electrically connected to the first well electrode, and a negative electrode is connected to the first terminal.

12. The semiconductor system according to claim 1, wherein the rectifying device is a diode, a negative electrode of the diode is electrically connected to the first well electrode, and a positive electrode is connected to the first terminal.

13. A semiconductor system comprising:
   a semiconductor substrate of a first conductivity-type having a surface layer, the surface layer having a trench groove selectively formed therein;
   a well region of a second conductivity-type, shallower than the trench groove, selectively disposed on the surface layer of the substrate, in contact with a sidewall of the trench groove;
   a source region of the first conductivity-type selectively disposed on a surface layer in the well region in contact with the sidewall of the trench groove;
   a cathode region of the first conductivity-type, disposed in contact with the sidewall of the trench groove and separated from the source region in the well region, the cathode region dividing the well region into a first well portion that is in contact with the semiconductor substrate and a second well portion that is not in contact with the semiconductor substrate;

an insulating film partially covering the source region, the second well portion, the cathode region and the first well portion;

a control electrode disposed along the sidewall of the trench, and extending through the insulating film;

a well electrode electrically connected to the first well portion;

an emitter electrode electrically connected to the source region and the second well portion;

an anode layer of the second conductivity-type, formed on a back surface side of the substrate;

an anode electrode electrically connected to the anode layer; and a diode connected between the emitter electrode and the well electrode.

14. The semiconductor system according to claim 13, further comprising an oxide film on a surface of the substrate, wherein the diode is formed of polysilicon of the first conductivity-type and polysilicon of the second conductivity-type, disposed through the oxide film.

15. The semiconductor system according to claim 13, further comprising an oxide film buried in the semiconductor substrate, wherein the diode is formed of first conductivity-type polysilicon and second conductivity-type polysilicon that are disposed on.

16. The semiconductor system according to claim 13, wherein with regard to an impurity concentration highest in a portion that is in contact with a sidewall of the trench groove of the well region and interposed between the source region and the cathode region, designated $C_{s-k}$, and an impurity concentration highest in a portion that is interposed between the emitter electrode and the semiconductor substrate, designated $C_{k-b}$, the relationship $C_{s-k} \leq C_{k-b}$ is satisfied.

17. The semiconductor system according to claim 13, wherein the source region, the well region, the cathode region, the insulating film and the control electrode form an insulating gate field effect transistor, and when the semiconductor system is in an on-state, the insulating gate field effect transistor does not operate in a saturation region.

18. The semiconductor system according to claim 13, wherein, when a forward current equal to a rated current flows between the anode electrode and the emitter electrode of the semiconductor system, a significant current does not flow through the diode in a forward or backward direction of the diode.

19. The semiconductor system according to claim 13, wherein a positive electrode of the diode is connected to the well electrode and a negative electrode of the diode is connected to the emitter electrode.

20. The semiconductor system according to claim 13, wherein a negative electrode of the diode is connected to the well electrode and a positive electrode of the diode is connected to the emitter electrode.

* * * * *